US012610564B2

(12) United States Patent
Tsai et al.

(10) Patent No.: US 12,610,564 B2
(45) Date of Patent: Apr. 21, 2026

(54) TREATMENT OF ELECTRODES OF MIM CAPACITORS

(71) Applicant: Taiwan Semiconductor Manufacturing Co., Ltd., Hsinchu (TW)

(72) Inventors: Shin-Hung Tsai, Hsinchu (TW); Cheng-Hao Hou, Hsinchu (TW); Da-Yuan Lee, Jhubei City (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 468 days.

(21) Appl. No.: 18/184,999

(22) Filed: Mar. 16, 2023

(65) Prior Publication Data

US 2024/0313044 A1    Sep. 19, 2024

(51) Int. Cl.
*H10D 1/00*    (2025.01)
*H01L 21/768*    (2006.01)
*H01L 23/522*    (2006.01)
*H10D 1/68*    (2025.01)

(52) U.S. Cl.
CPC ....... *H10D 1/042* (2025.01); *H01L 21/76805* (2013.01); *H01L 21/76843* (2013.01); *H01L 21/7687* (2013.01); *H01L 23/5223* (2013.01); *H01L 23/5226* (2013.01); *H10D 1/716* (2025.01)

(58) Field of Classification Search
CPC ........ H10D 1/696; H10D 1/711; H10D 1/712; H10D 1/714; H10D 1/716; H10D 1/682; H10D 1/684; H10D 1/688
See application file for complete search history.

(56) References Cited

U.S. PATENT DOCUMENTS

| | | | |
|---|---|---|---|
| 7,084,042 B2 | 8/2006 | Olewine et al. | |
| 7,456,072 B2 | 11/2008 | Olewine et al. | |
| 8,178,404 B2 | 5/2012 | Olewine et al. | |
| 2002/0168847 A1* | 11/2002 | Narwankar | C23C 28/00 257/E21.011 |
| 2003/0025146 A1 | 2/2003 | Narwankar et al. | |
| 2022/0328508 A1* | 10/2022 | Lin | H10D 1/696 |

FOREIGN PATENT DOCUMENTS

| | | | |
|---|---|---|---|
| CN | 112259613 A | | 1/2021 |
| CN | 115472743 | * | 12/2022 |
| KR | 20110042460 | * | 4/2011 |
| TW | 200631081 A | | 9/2006 |

* cited by examiner

*Primary Examiner* — Thanhha S Pham
(74) *Attorney, Agent, or Firm* — Slater Matsil, LLP

(57) ABSTRACT

A method includes forming a first electrode, performing a first treatment process on a first oxide layer over the first electrode, wherein the first treatment process is performed using a first process gas comprising ammonia, depositing a high-k dielectric layer over the first oxide layer, forming a second electrode over the high-k dielectric layer, forming a first contact plug electrically connecting to the first electrode, and forming a second contact plug electrically connecting to the second electrode.

20 Claims, 20 Drawing Sheets

TREATMENT OF ELECTRODES OF MIM CAPACITORS

BACKGROUND

Metal-Insulator-Metal (MIM) capacitors have been widely used in functional circuits such as mixed signal circuits, analog circuits, Radio Frequency (RF) circuits, Dynamic Random-Access Memories (DRAMs), embedded DRAMs, and logic operation circuits. For example, in system-on-chip applications, different capacitors for different functional circuits may be used to serve different purposes. In mixed-signal circuits, capacitors may also be used as decoupling capacitors and high-frequency noise filters. For DRAM and embedded DRAM circuits, capacitors may be used for memory storage, while for RF circuits, capacitors may be used in oscillators and phase-shift networks for coupling and/or bypassing purposes. For microprocessors, capacitors may be used for decoupling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
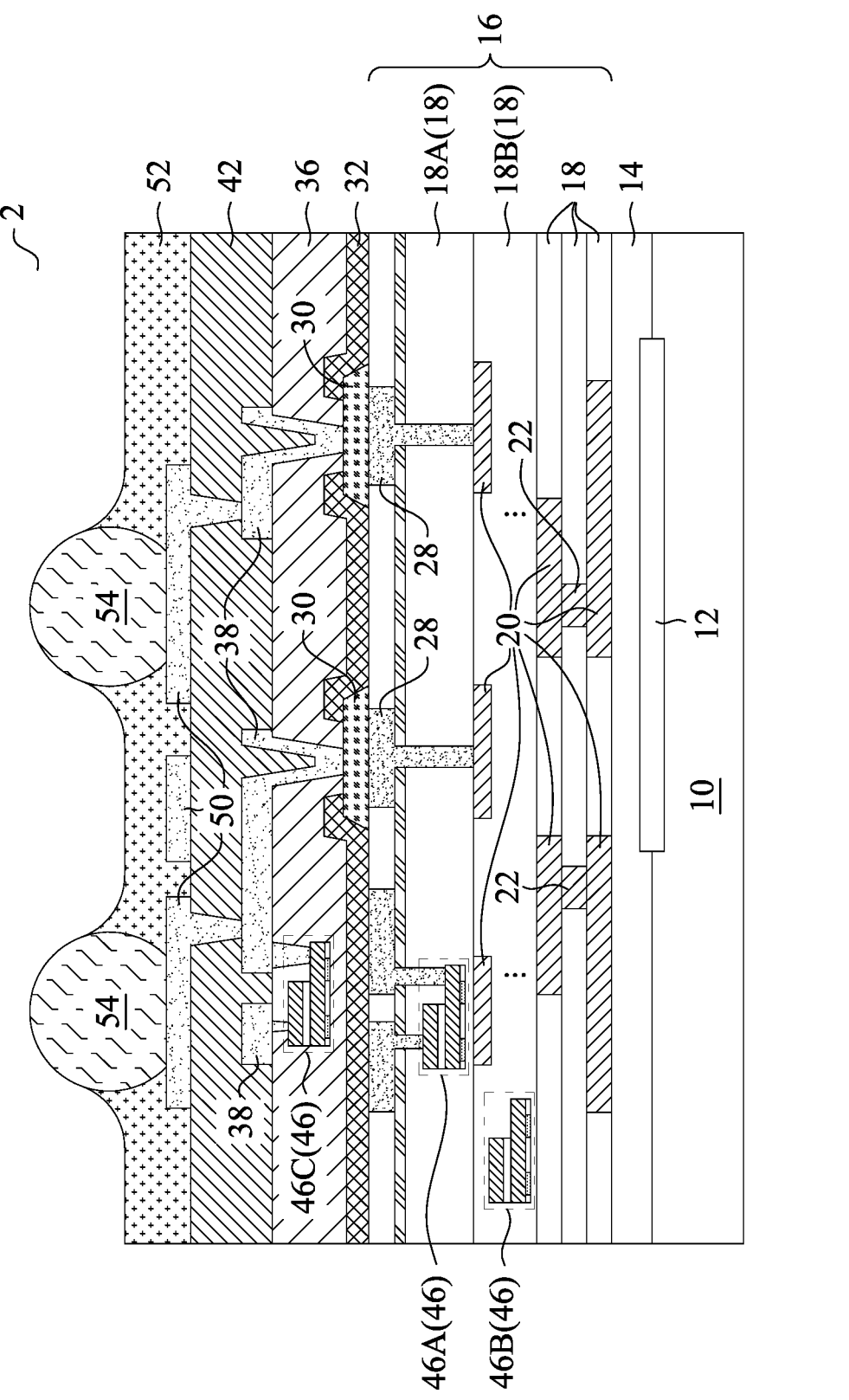
FIG. 1 illustrates a cross-sectional view of a package component including one or a plurality of Metal-Insulator-Metal (MIM) capacitors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A capacitor and the method of forming the same are provided. In accordance with some embodiments, the formation of a capacitor insulator in a Metal-Insulator-Metal (MIM) capacitor includes depositing a first electrode, performing a first treatment using nitrogen plasma on an oxide layer formed on the first electrode, performing a second treatment process using ammonia, and depositing a high-k dielectric layer as a part of a capacitor insulator. A second electrode is then deposited over the high-k dielectric layer. By performing the treatment ammonia (and possibly nitrogen plasma), the oxide layer becomes nitrogen-rich and having a higher nitrogen atomic percentage. Accordingly, in the subsequent formation of the high-k dielectric layer, the oxygen in the high-k dielectric layer is less likely to be scavenged by the first electrode. The reliability of the MIM capacitor is thus improved.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIG. 1 illustrates a cross-sectional view of package component 2 including a capacitor(s) therein. Package component 2 may be a device wafer, an interposer wafer, a package (such as an Integrated Fan-Out (InFO) package), or the like. In the subsequently illustrated embodiments, a device wafer is used as an example, and capacitors may be formed in the back-end redistribution structure of the device wafer, while the capacitor(s) may be formed in other structures. An example structure of wafer 2 is discussed herein to show where a capacitor(s) may be formed. The capacitor in accordance with the embodiments of the present disclosure, however, are not limited to the illustrative structure of package component 2.

Referring to FIG. 1, wafer 2 includes semiconductor substrate 10. In accordance with some embodiments, semiconductor substrate 10 is a bulk silicon substrate or a silicon-on-insulator substrate. In accordance with alternative embodiments of the present disclosure, other semiconductor materials that include group III, group IV, and/or group V elements may also be used, which may include silicon germanium, carbon-doped silicon, and/or III-V compound semiconductor materials. Integrated circuit devices 12, which may include active devices such as transistors are formed at a surface of semiconductor substrate 10.

Wafer 2 may further include Inter-Layer Dielectric (ILD) 14 and interconnect structure 16 over semiconductor substrate 10. Interconnect structure 16 includes metal lines 20 and vias 22, which are formed in dielectric layers 18. The metal lines at a same level are collectively referred to as being a metal layer hereinafter. Accordingly, interconnect structure 16 may include a plurality of metal layers that are interconnected through vias 22. Metal lines 20 and vias 22 may be formed of copper or copper alloys, although they can also be formed of other metals. In accordance with some embodiments, dielectric layers 18 are formed of low-k dielectric materials. The dielectric constants (k values) of the low-k dielectric materials may be lower than about 3.5, or lower than about 3.0, for example.

Metal pads 30 are formed over interconnect structure 16, and may be electrically coupled to integrated circuit devices 12 through metal lines 20 and vias 22. Metal pads 30 may be aluminum pads or aluminum-copper pads, and hence are alternatively referred to as aluminum pads 30 hereinafter, while other metallic materials may be used. In accordance with some embodiments, metal pads 30 are in physical contact with the underlying metal vias or metal lines (or pads) in the top metal layer in interconnect structure 16. For example, as shown in FIG. 1, metal pads 30 have bottom surfaces in contact with the top surfaces of metal pads 28.

As also shown in FIG. 1, passivation layer 32 is formed over interconnect structure 16. Passivation layer 32 has a k value equal to or greater than 3.8, and is formed using a non-low-k dielectric material(s). In accordance with some embodiments, passivation layer 32 is a composite layer including a silicon oxide layer (not shown), and a silicon nitride layer (not shown) over the silicon oxide layer. Passivation layer 32 may also be formed of other non-porous dielectric materials such as Un-doped Silicate Glass (USG), silicon oxynitride, and/or the like.

Passivation layer 32 is patterned, so that some portions of passivation layer 32 cover the edge portions of aluminum pads 30, and some middle portions of aluminum pads 30 are exposed through the openings in passivation layer 32. Passivation layer 32 and metal pads 30 may have some portions level with each other in accordance with some embodiments.

Polymer layer 36 is formed over metal pads 30 and passivation layer 32. In accordance with some embodiments, polymer layer 36 is formed of polybenzoxazole (PBO). In accordance with alternative embodiments, polymer layer 36 is formed of other polymers such as polyimide, benzocyclobutene (BCB), or the like. The material of polymer layer 36 may be photo sensitive, although non-photo-sensitive materials may also be used.

Post-Passivation Interconnect (PPI) 38 may formed, which includes line portions over polymer layer 36, and via portions extending into polymer layer 36. PPI 38 is thus electrically connected to metal pads 30. PPI 38 may be formed of copper or a copper alloy, for example.

Polymer layer 42 is formed over polymer layer 36 and PPI 38. In accordance with some embodiments, polymer layer 42 is formed of a polymer such as PBO, polyimide, BCB, or the like. The material of polymer layer 42 may be photo sensitive, although non-photo-sensitive materials may also be used. Polymer layers 36 and 42 may be formed of a same type of polymer, or may be formed of different types of polymers.

PPI 50 is formed over polymer layer 42, and is electrically connected to PPI 38 and integrated circuit 12. PPI 50 includes a plurality of redistribution lines. In accordance with some embodiments, PPI 50 is in dielectric layer 52, which encircles PPI 50, and contacts the top surface of polymer layer 42. Dielectric layer 52 may be a molding compound, a polymer layer, or the like. The top surfaces and the sidewalls of PPI 50 may also be in physical contact with dielectric layer 52.

In accordance with some embodiments, electrical connectors 54 are formed to electrically connect to PPI 50. Electrical connectors 54 may include metal regions, which may include solder balls placed on PPI 50. Electrical connectors 54 may also include metal pillars. In the embodiments in which electrical connectors 54 include solder, the solder may be placed or plated, and the plating of solder may be similar to the formation of PPI 38. Electrical connectors 54 have upper portions over the top surface of dielectric layer 52, and lower portions embedded in dielectric layer 52. After the formation of electrical connectors 54, wafer 2 may be sawed into individual package components (which may be device dies), each including integrated circuit device 12 and one capacitor 46 or a plurality of capacitors 46.

In accordance with some embodiments, one or more capacitor 46 (represented by 46A, 46B, and 46C) are formed in one of dielectric layers 18, or in polymer layer 36 or 42. For example, capacitor 46 may be in the top dielectric layer immediately underlying the passivation layer 32, as represented by capacitor 46A. Capacitor 46 may also be in a dielectric layer under the top dielectric layer, as represented by capacitor 46B. Capacitor 46 may also be in a polymer layer such as polymer layer 36 or 42, as represented by capacitor 46C. In accordance with some embodiments, capacitor 46 is a decoupling capacitor, with the top electrode and the bottom electrode of capacitor 46 being electrically coupled to power supply lines such as VDD and VSS. Accordingly, capacitor 46 is used to filter noise and/or also used as a power storage for reducing the voltage variation resulted from the current-drawn from the power source. In accordance with alternative embodiments, the top electrode and the bottom electrode of capacitor 46 are connected to signal lines, and capacitor 46 is used to filter noise. The top electrode and the bottom electrode of capacitor 46 are connected to contact plugs, as will be provided in the subsequently discussed process flow. In accordance with alternative embodiments, capacitor 46 is used for other purposes such as in Dynamic Random-Access Memory (DRAM) cells.

Figure 24:
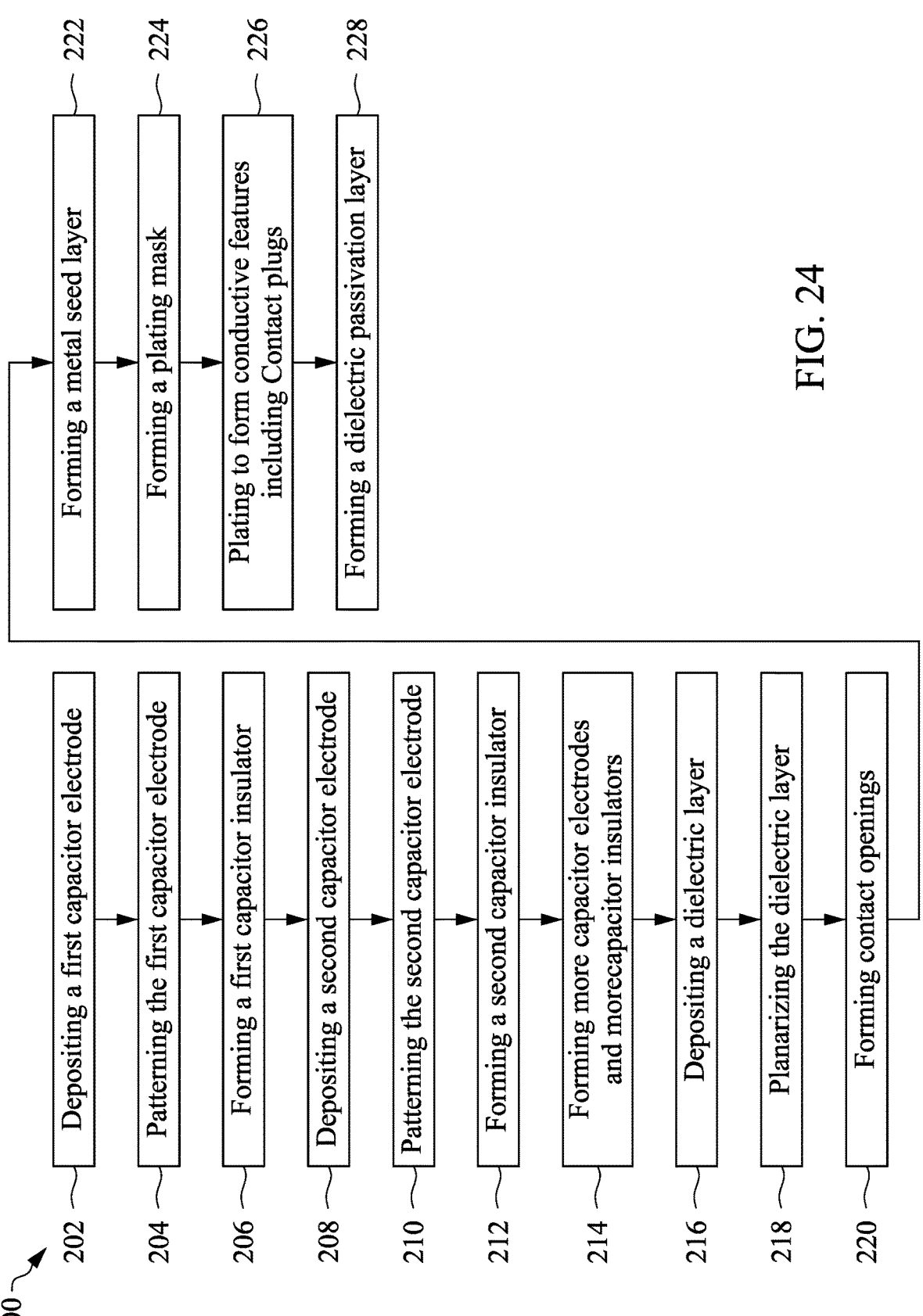
FIG. 24 illustrates a process flow for forming a MIM capacitor in accordance with some embodiments.

FIGS. 2 through 14 illustrate the cross-sectional views of intermediate stages in the formation of capacitor 46 in wafer 2 in accordance with some embodiments. The processes shown in FIG. 2 through 14 are also illustrated schematically in the process flow 200 as shown in FIG. 24. The process shown in FIGS. 2 through 14 may represent the process for forming capacitor 46A in dielectric layer 18A as shown in FIG. 1. The concept of the example embodiments may be used for forming capacitors in various layers, such as what are represented by capacitors 46B and 46C in FIG. 1.

Figure 2:
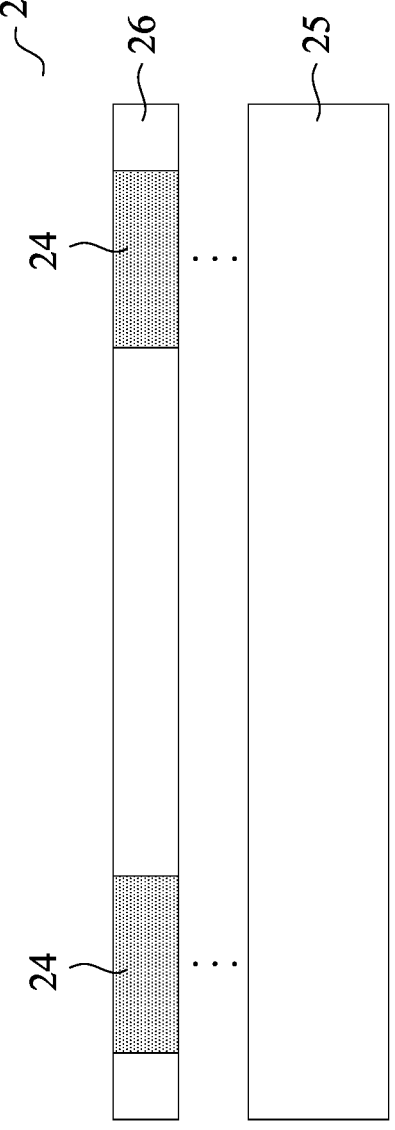
FIGS. 2 through 14 illustrate the cross-sectional views of intermediate stages in the formation of a MIM capacitor in accordance with some embodiments.

Referring to FIG. 2, conductive features 24 are illustrated. The portions of wafer 2 underlying conductive features 24 are represented as features 25. The details of features 25 are not illustrated, and may be found referring to FIG. 1. In accordance with some embodiments in which capacitor 46A (FIG. 1) is to be formed, conductive features 24 are the metal lines or metal pads formed in dielectric layer 18B (FIG. 1). In accordance with alternative embodiments in which capacitor 46B (FIG. 1) is to be formed, conductive features 24 are the metal lines or metal pads underlying dielectric layer 18B. In accordance with yet other embodiments in which capacitor 46C (FIG. 1) is to be formed, conductive features 24 are metal pads 30 or some portions of PPI 38.

Figure 3:
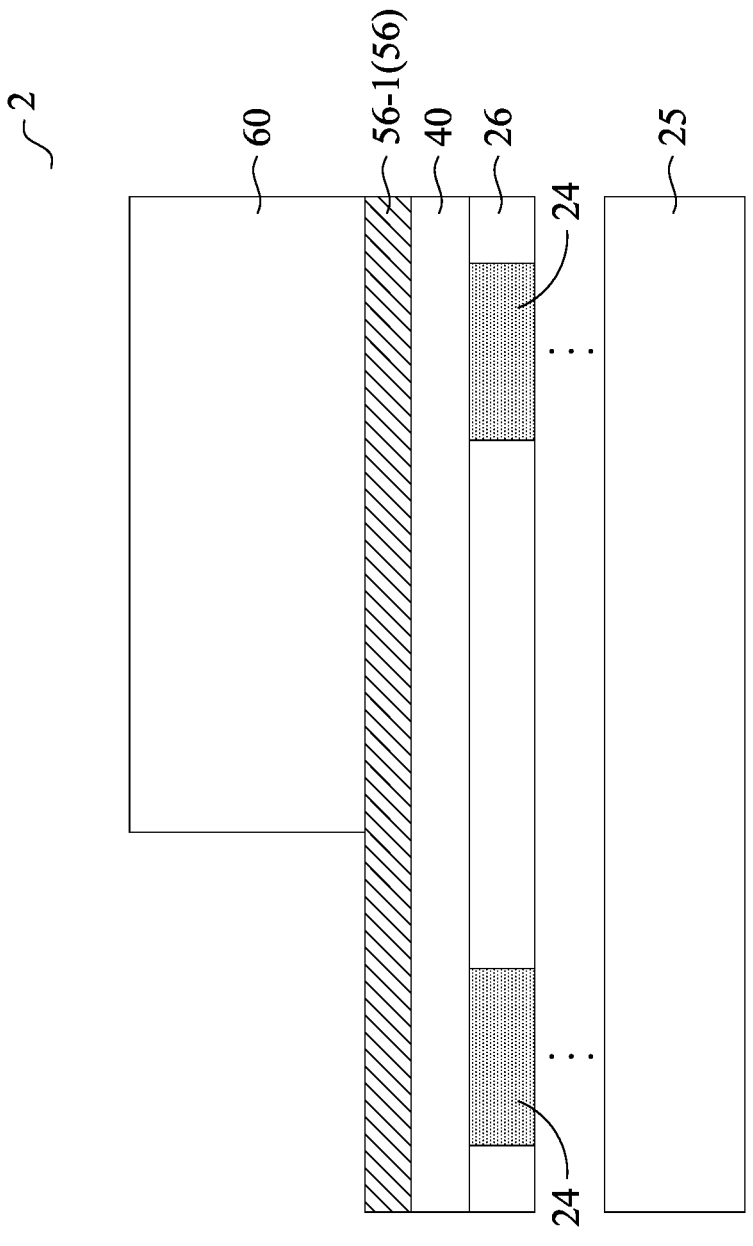

Referring to FIG. 3, dielectric layer 40 is formed over conductive features 24. Although not shown, an etch stop layer may be (or may not be) formed between conductive features 23 and dielectric layer 40. Depending on the position, dielectric layer 40 may be formed of an inorganic material such as USG, silicon carbide, silicon carbo-nitride (SiCN), silicon oxide, silicon nitride, or the like, combinations thereof, and/or multi-layers thereof. Dielectric layer 40 may be formed using Plasma Enhance Chemical Vapor Deposition (PECVD), Low-Pressure Chemical Vapor Deposition (LPCVD), Atomic Layer Deposition (ALD), or the like.

Next, bottom capacitor electrode 56-1 is deposited as a blanket layer. The respective process is illustrated as process 202 in the process flow 200 as shown in FIG. 24. Bottom capacitor electrode 56-1 is formed of a conductive material. For example, bottom capacitor electrode 56-1 may be formed of or comprise a metal nitride such as titanium nitride (TiN), tantalum nitride (TaN), or the like. The deposition process may include ALD, Chemical Vapor Deposition (CVD), PECVD, or the like.

Etching mask 60 is then formed, and is patterned. In accordance with some embodiments, etching mask 60 comprises a photoresist. Next, an etching process is performed to pattern bottom capacitor electrode 56-1. The respective process is illustrated as process 204 in the process flow 200 as shown in FIG. 24. In accordance with some embodiments, the etching is performed through a dry etching process. The etching gas may include a chlorine-based gas such as TiCl$_4$, TaCl$_4$, WCl$_4$, chlorine (Cl$_2$), and/or the like. The etching gas may also include a fluorine-containing gas such as CHF$_3$, CF$_4$, or the like, or the combination of the aforementioned gases. Oxygen (O$_2$) may also be included in the etching gas.

Figures 4, 5:
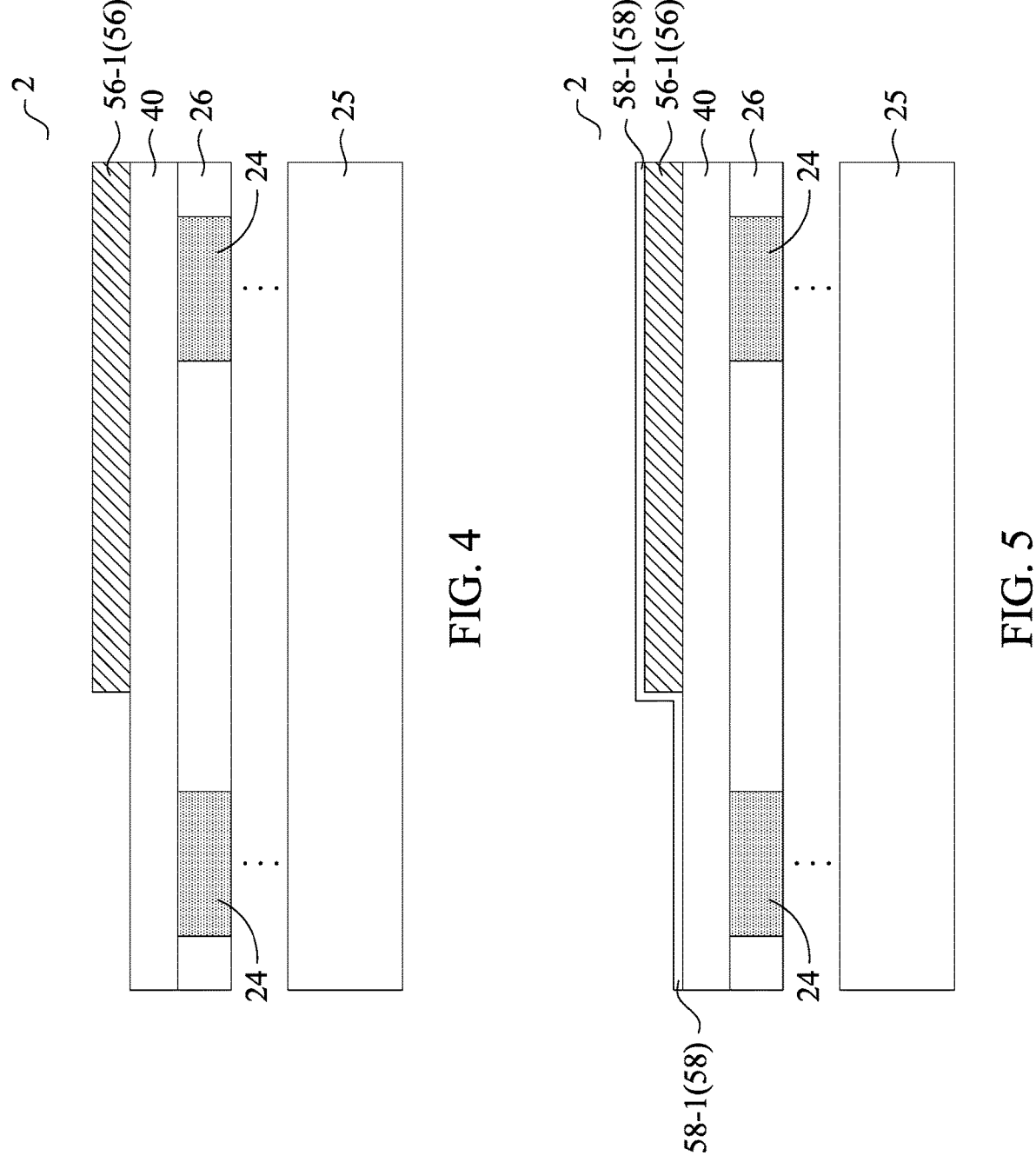

In accordance with alternative embodiments, the etching is performed through a wet etching process. The etching chemical may include the mixture of NH$_4$OH (ammonia water) and H$_2$O$_2$, the mixture of H$_2$O$_2$ and H$_2$O, and/or the like. Etching mask 60 is then removed, and the resulting structure is shown in FIG. 4. A cleaning process, which may be a wet process, may be performed to remove by-products.

Figure 25:
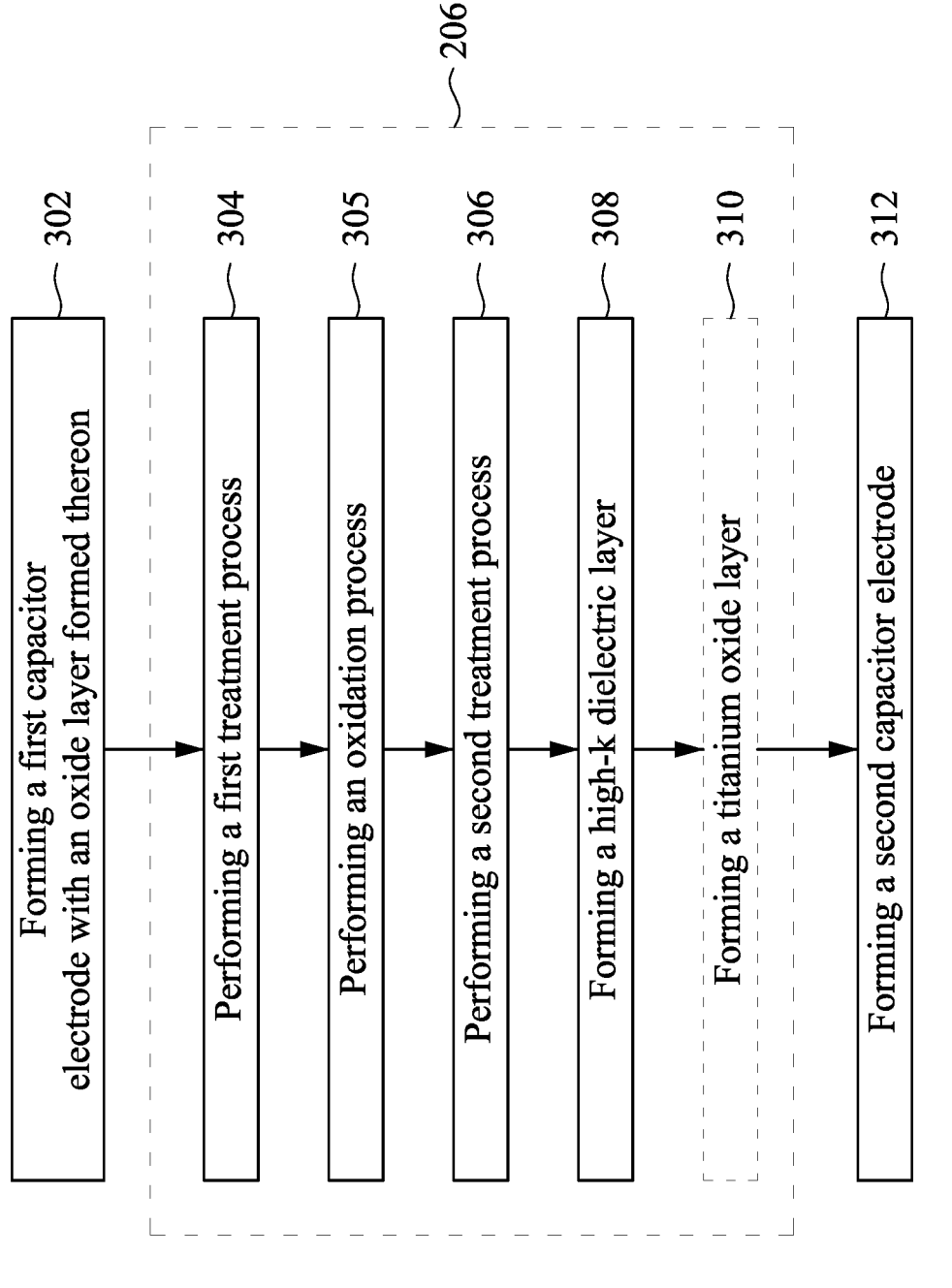
FIG. 25 illustrates a process flow for forming a capacitor insulator and the respective overlying and underlying capacitor electrodes in accordance with some embodiments.

FIG. 5 illustrates the formation of capacitor insulator 58-1. The respective process is illustrated as process 206 in the process flow 200 as shown in FIG. 24. The detailed formation processes, structures, and materials of capacitor insulator 58-1 are discussed in detail referring to the processes as shown in FIGS. 15 through 20. The detailed process flow of process 206 is also shown in FIG. 25.

In accordance with some embodiments, capacitor insulator 58-1 is a composite layer including a plurality of sub-layers, which may include a first dielectric layer and a second dielectric layer over the first dielectric layer. The first dielectric layer may be a nitrogen-rich titanium oxide (TiO) layer. The second dielectric layer may include hafnium zirconium oxide (HfZrO), zirconium oxide (ZrO$_2$), hafnium oxide (HFO$_2$), or the like. There may be, or may not be, a third dielectric layer over the second dielectric layer. The third dielectric layer may comprise titanium oxide or another dielectric material. The formation process of the dielectric layers may include ALD, CVD, or the like.

Figure 6:
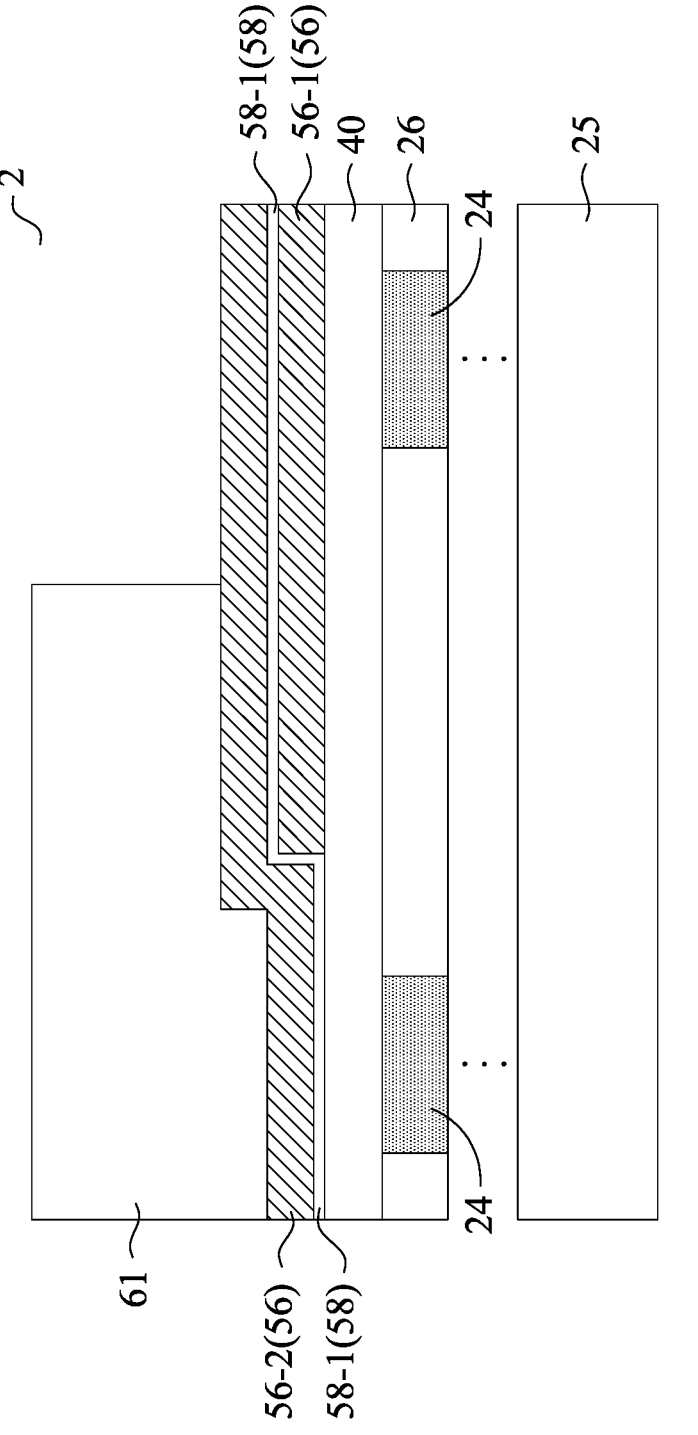

Referring to FIG. 6, capacitor electrode 56-2 is deposited as a blanket layer. The respective process is illustrated as process 208 in the process flow 200 as shown in FIG. 24. In accordance with some embodiments, capacitor electrode 56-2 is formed of or comprises the same or similar material (such as TiN or TaN) as bottom capacitor electrode 56-1. A patterned etching mask 61 is then formed, which may be a single layer formed of a photoresist, or may be a tri-layer etching mask.

Capacitor electrode 56-2 is then etched using etching mask 61 to define the patterns. The respective process is illustrated as process 210 in the process flow 200 as shown in FIG. 24. In the etching of capacitor electrode 56-2, capacitor insulator 58-1 is used as an etch stop layer. Since capacitor insulator 58-1 includes multiple sub-layers, the etching may be stopped on the top sub-layer (such as a TiO layer) in capacitor insulator 58-1, or may be stopped on an intermediate layer (such as a HfZrO layer). Etching mask 61 is then removed. The resulting structure is shown in FIG. 7.

Figures 7, 8:
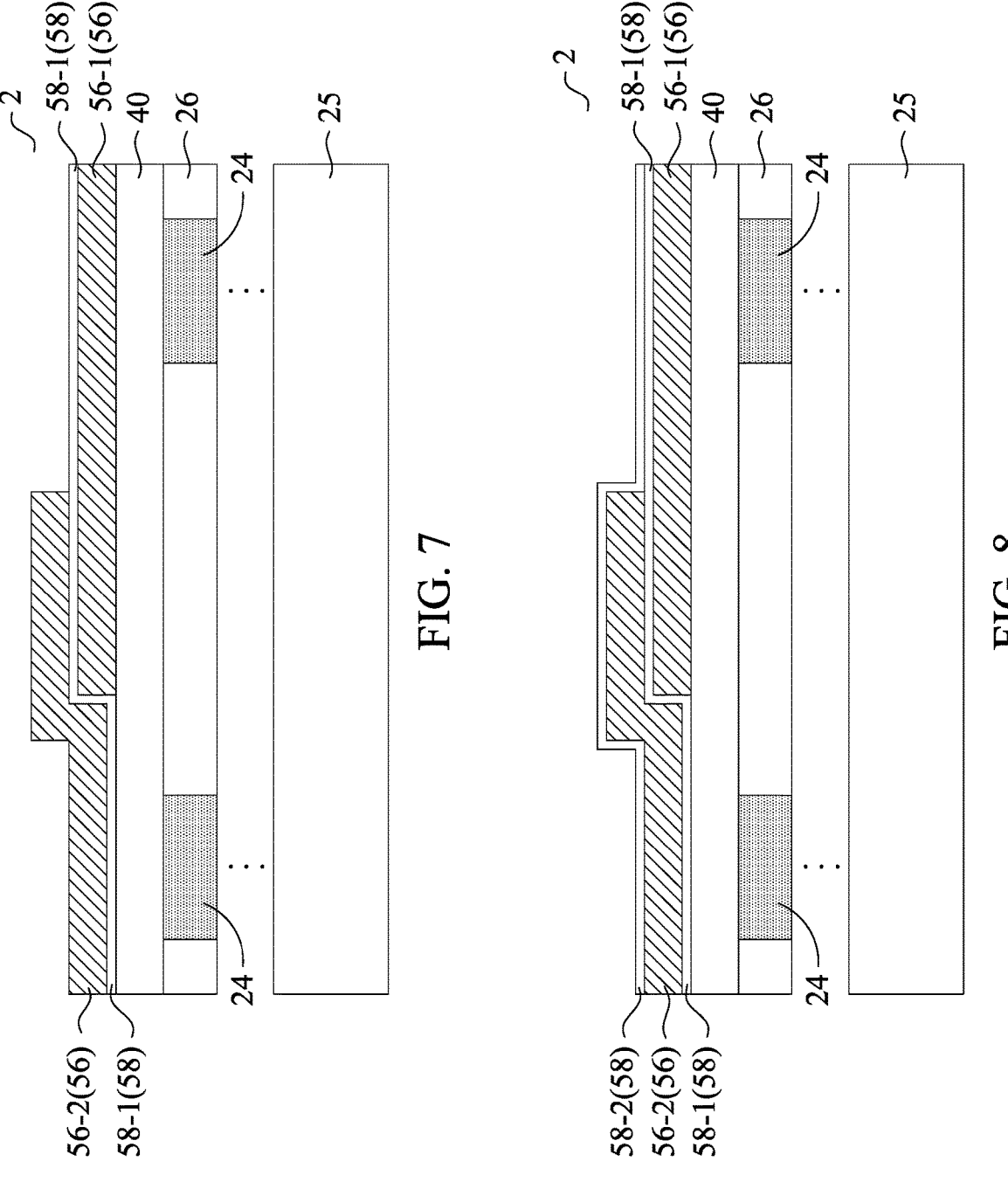
Figure 9:
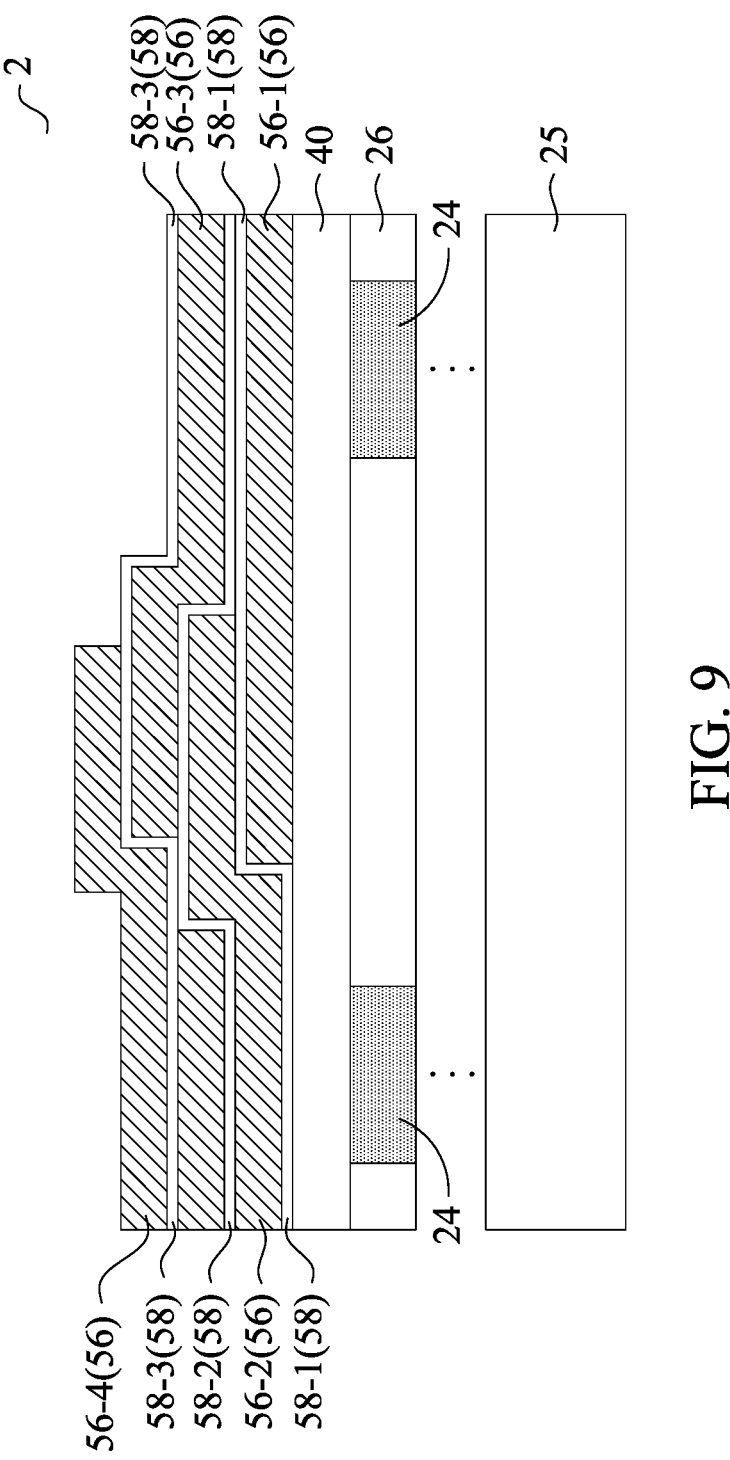

In accordance with some embodiments, more capacitor electrodes and capacitor insulators (as shown in FIGS. 8 and 9) are formed over the structure shown in FIG. 7 to increase the capacitance of the resulting capacitor. In accordance with alternative embodiments, no more capacitor electrodes and capacitor insulators are formed over capacitor electrode 56-2, and the process flow proceeds to the process shown in FIG. 10.

Referring to FIG. 8, capacitor insulator 58-2 is formed. The respective process is illustrated as process 212 in the process flow 200 as shown in FIG. 24. In accordance with some embodiments, capacitor insulator 58-2 has a multi-layer structure including a plurality of sub-layers. The structure and the formation process may also be essentially the same as that of capacitor insulator 58-1, and the structure and the formation process may be found referring to FIGS. 15 through 20 and the related discussion.

FIG. 9 illustrates the formation of more capacitor electrodes (such as capacitor electrodes 56-3 and 56-4) and more capacitor insulators (such as capacitor insulator 58-3). The respective process is illustrated as process 214 in the process flow 200 as shown in FIG. 24. It is appreciated that the structure illustrated in FIG. 9 is an example, and the formed capacitor may include more or fewer capacitor electrodes and capacitor insulators. The formation of capacitor electrodes 56-3 and 56-4 may be the same or similar to the formation of capacitor electrode 56-1. The formation of capacitor insulator 58-3 may be the same or similar to the formation of capacitor insulator 58-1, which may be found referring to FIGS. 15 through 20. Throughout the description, capacitor electrodes 56-1, 56-2, 56-3 and 56-4 are collectively and individually referred to as capacitor electrodes 56. Capacitor insulators 58-1, 58-2, and 58-3 are collectively and individually referred to as capacitor insulators 58.

Figure 10:
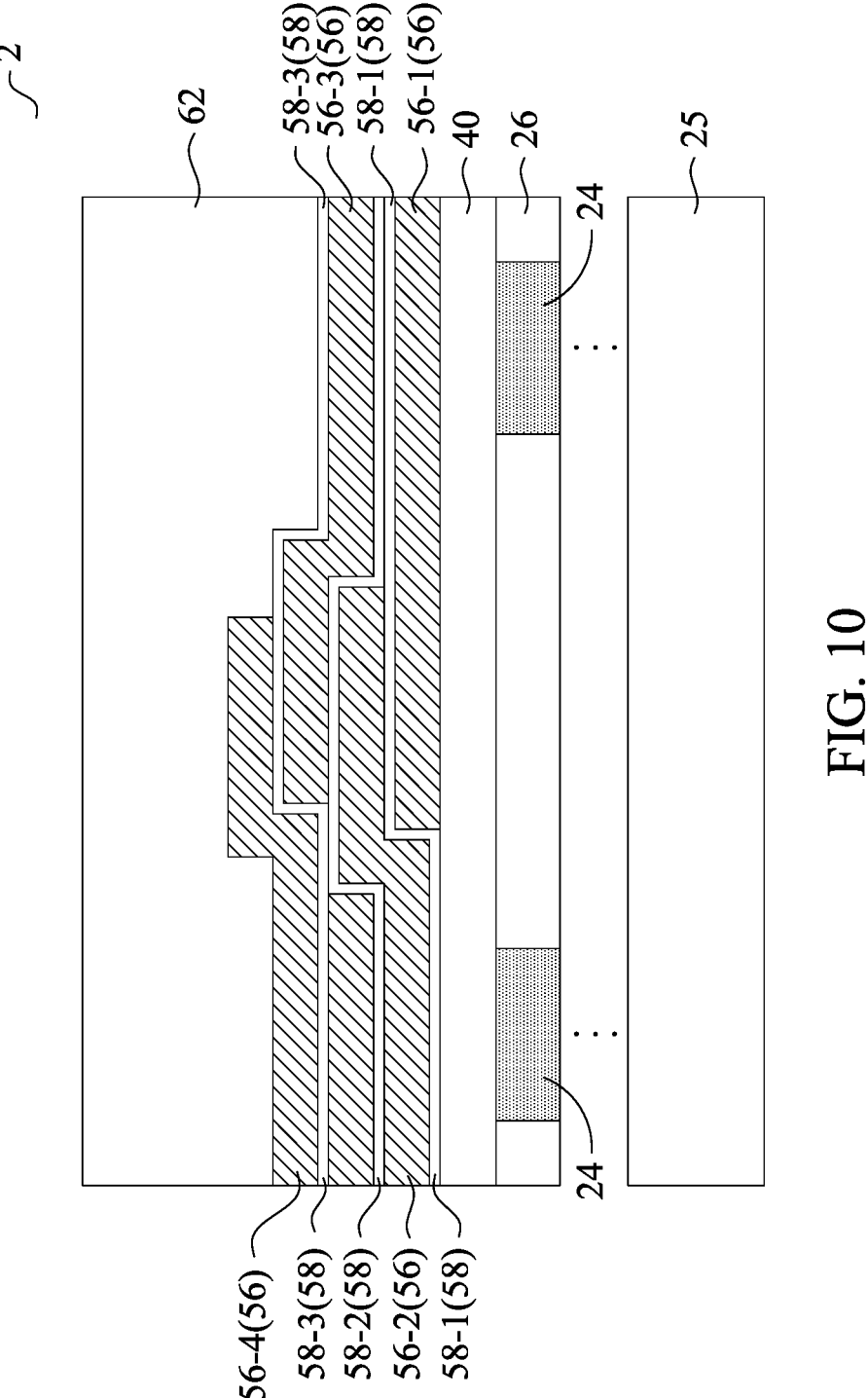

Next, as shown in FIG. 10, dielectric layer 62 is deposited. The respective process is illustrated as process 216 in the process flow 200 as shown in FIG. 24. In accordance with some embodiments, dielectric layer 62 is formed of or comprises USG, silicon nitride, silicon oxide, silicon oxynitride, silicon oxycarbide, or the like. In accordance with alternative embodiments, dielectric layer 62 may be formed of a low-k dielectric material, for example, when the resulting capacitor is one of capacitors 46A and 46B (FIG. 1). In accordance with yet alternative embodiments, dielectric layer 62 may be polymer layer 36 or 42 in the embodiments shown in FIG. 1. After the deposition of dielectric layer 62, a planarization process such as a Chemical Mechanical Polish (CMP) process or a mechanical grinding process may be performed, so that the top surface of dielectric layer 62 is planar. The respective process is illustrated as process 218 in the process flow 200 as shown in FIG. 24.

Figure 11:
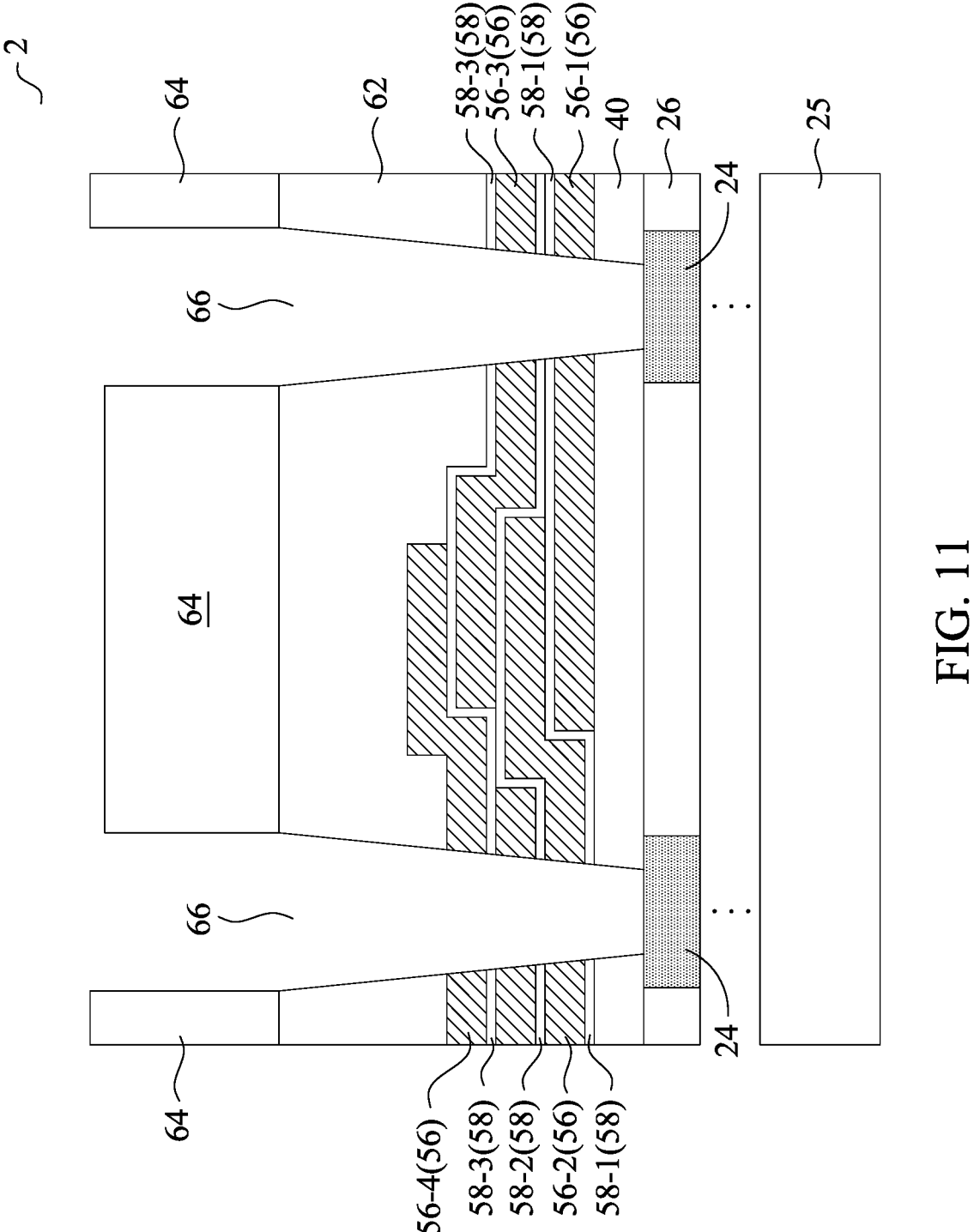

Referring to FIG. 11, a photo lithography process is performed. Etching mask 64 is first formed. In accordance with some embodiments, etching mask 64 comprises a photoresist, and may include anti-reflective coating therein. Etching mask 64 may have a single-layer structure, a duallayer structure, a tri-layer structure, or the like. Next, etching processes are performed to etch dielectric layer 62, capacitor electrodes 56, and capacitor insulators 58. Contact openings 66 are formed, and dielectric layer 40 is also etched-through, so that conductive features 24 are revealed to contact openings 66. The respective process is illustrated as process 220 in the process flow 200 as shown in FIG. 24.

The etching of capacitor electrodes 56-1, 56-2, 56-3, and 56-4 may use the similar etching chemicals (such as gases or chemical solutions) as what is used for patterning capacitor electrodes 56-2 and 56-2. For example, chlorine-based gas such as $TiCl_4$, $TaCl_4$, $WCl_4$, chlorine ($Cl_2$), and/or the like, fluorine-containing gas such as $CHF_3$, $CF_4$, or the like, or the combinations of these gases, may be used if dry etching processes are used. The mixture of $NH_4OH$ and $H_2O_2$, the mixture of $H_2O_2$ and $H_2O$, and/or the like may be used when wet etching processes are used.

The etching of capacitor insulators 58-1, 58-2, and 58-3 may adopt HBr. $BCl_3$, $Cl_2$, $CF_4$, $CH_4$, $C_4F_8$, $CHF_3$, $SF_6$, $O_2$, and/or the like when dry etching is used, depending on the specific materials of capacitor insulators 58-1, 58-2, and 58-3. When wet etching processes are adopted, phosphoric acid solution, HF solution, and/or the like may be used.

The etching of dielectric layer 40 may be performed through a dry etching process. The etching gas may include a fluorine-containing gas such as $CF_4$, $NF_3$, $SF_6$, $CHF_3$, or combinations thereof. Other gases such as $O_2$, $N_2$, $H_2$, Ar, NO, and the like, or combinations thereof may also be added. A bias power is applied, so that the etching is anisotropic. After the etching process, conductive features 24 are exposed to contact openings 66. Etching mask 64 is then removed.

Figure 12:
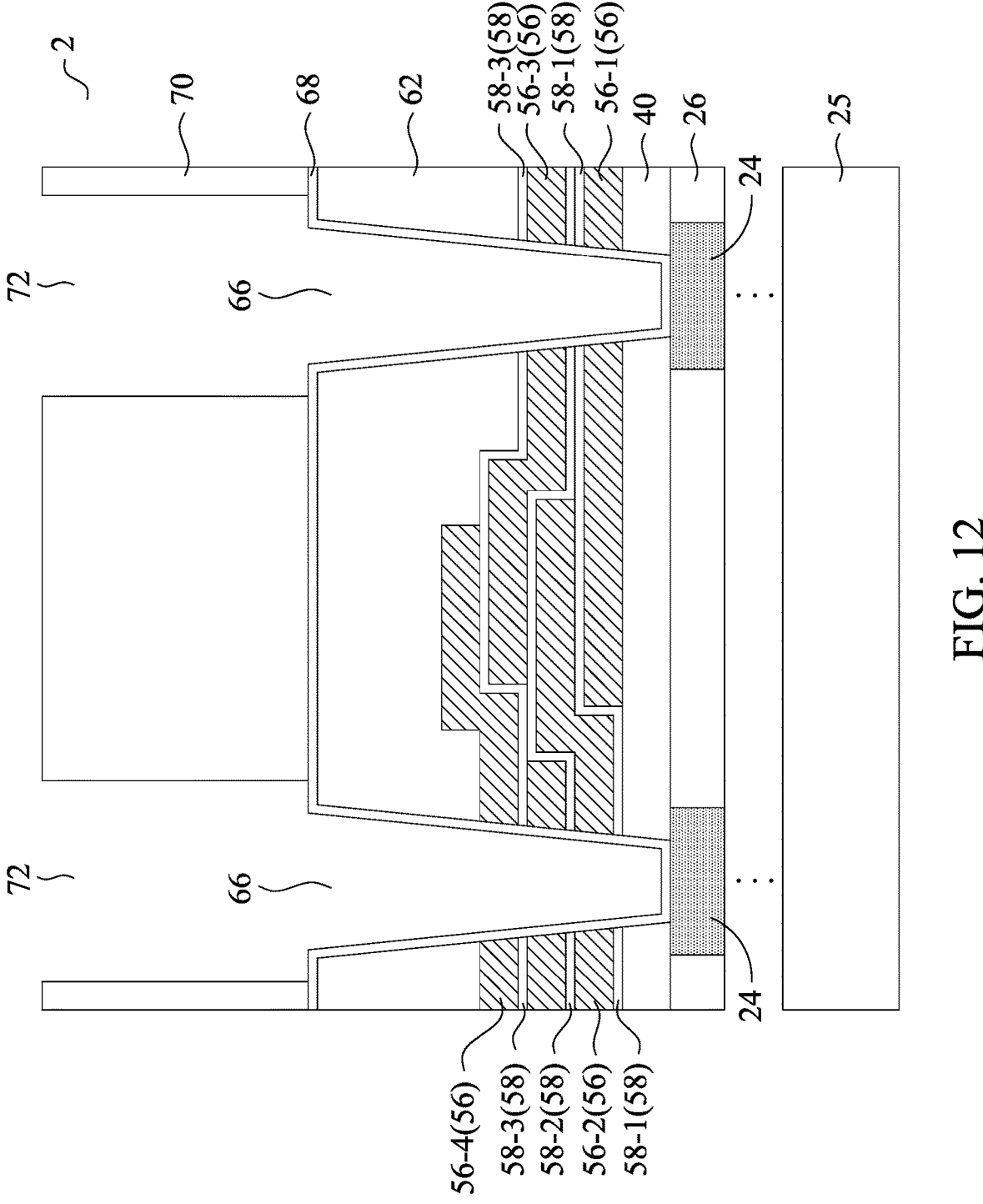

FIG. 12 illustrates the deposition of metal seed layer 68. The respective process is illustrated as process 222 in the process flow 200 as shown in FIG. 24. In accordance with some embodiments, metal seed layer 68 comprises a titanium layer and a copper layer over the titanium layer. In accordance with alternative embodiments, metal seed layer 68 comprises a copper layer in contact with dielectric layer 62. The deposition process may be performed using Physical Vapor Deposition (PVD), CVD, Metal Organic Chemical Vapor Deposition (MOCVD), or the like.

FIG. 12 further illustrates the formation of patterned plating mask 70. The respective process is illustrated as process 224 in the process flow 200 as shown in FIG. 24. In accordance with some embodiments, plating mask 70 is formed of or comprises photoresist. Openings 72 are formed in the patterned plating mask 70 to reveal metal seed layer 68.

Figure 13:
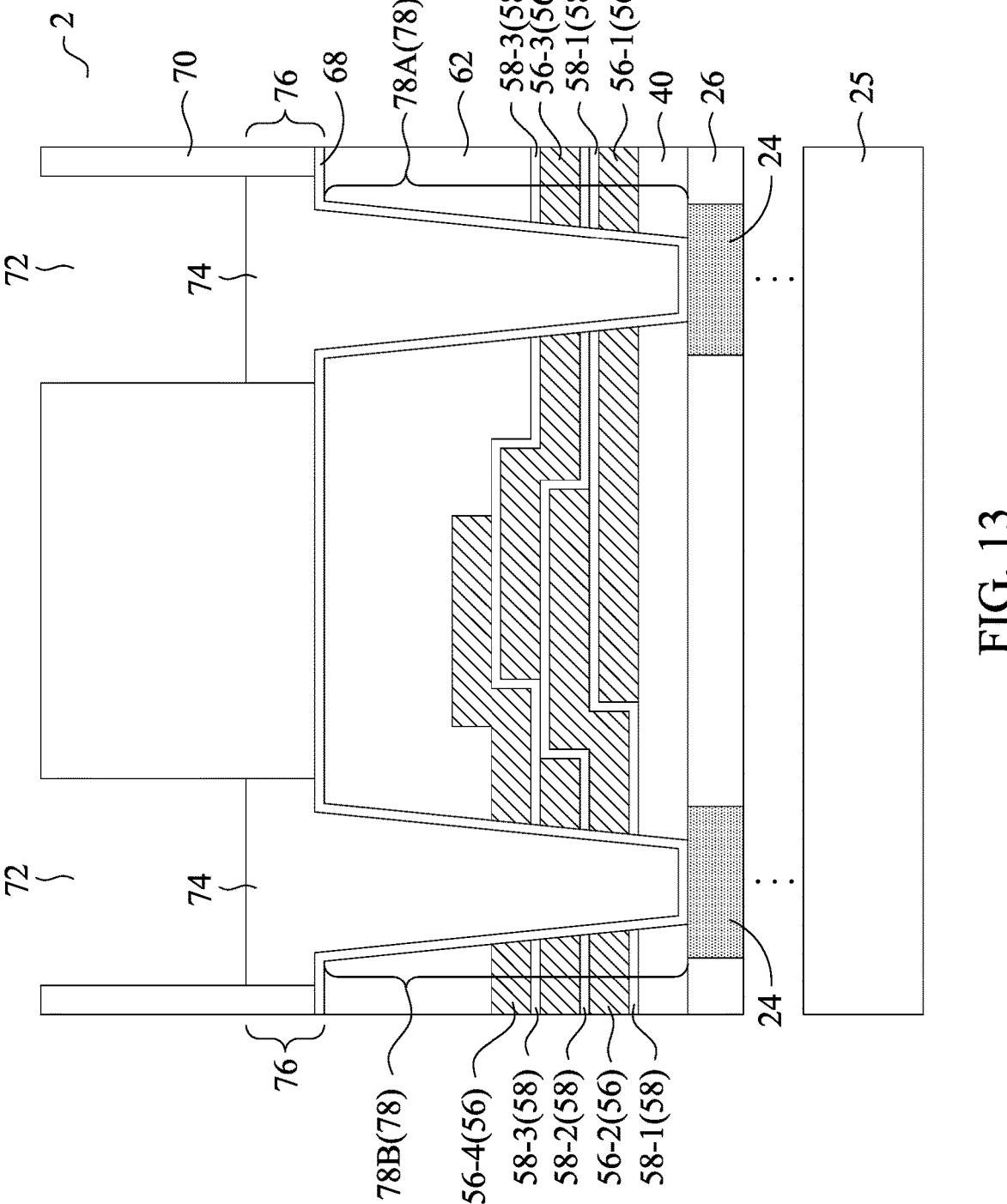

FIG. 13 illustrates the formation of conductive material 74 into openings 72 and on metal seed layer 68. Contact plugs 78 and conductive lines 76 are thus formed. The respective process is illustrated as process 226 in the process flow 200 as shown in FIG. 24. In accordance with some embodiments, the formation of conductive material 74 includes a plating process, which may include an electro-chemical plating process, an electroless plating process, or the like. Conductive material 74 may include copper, aluminum, nickel, tungsten, or the like, or alloys thereof.

Figure 14:
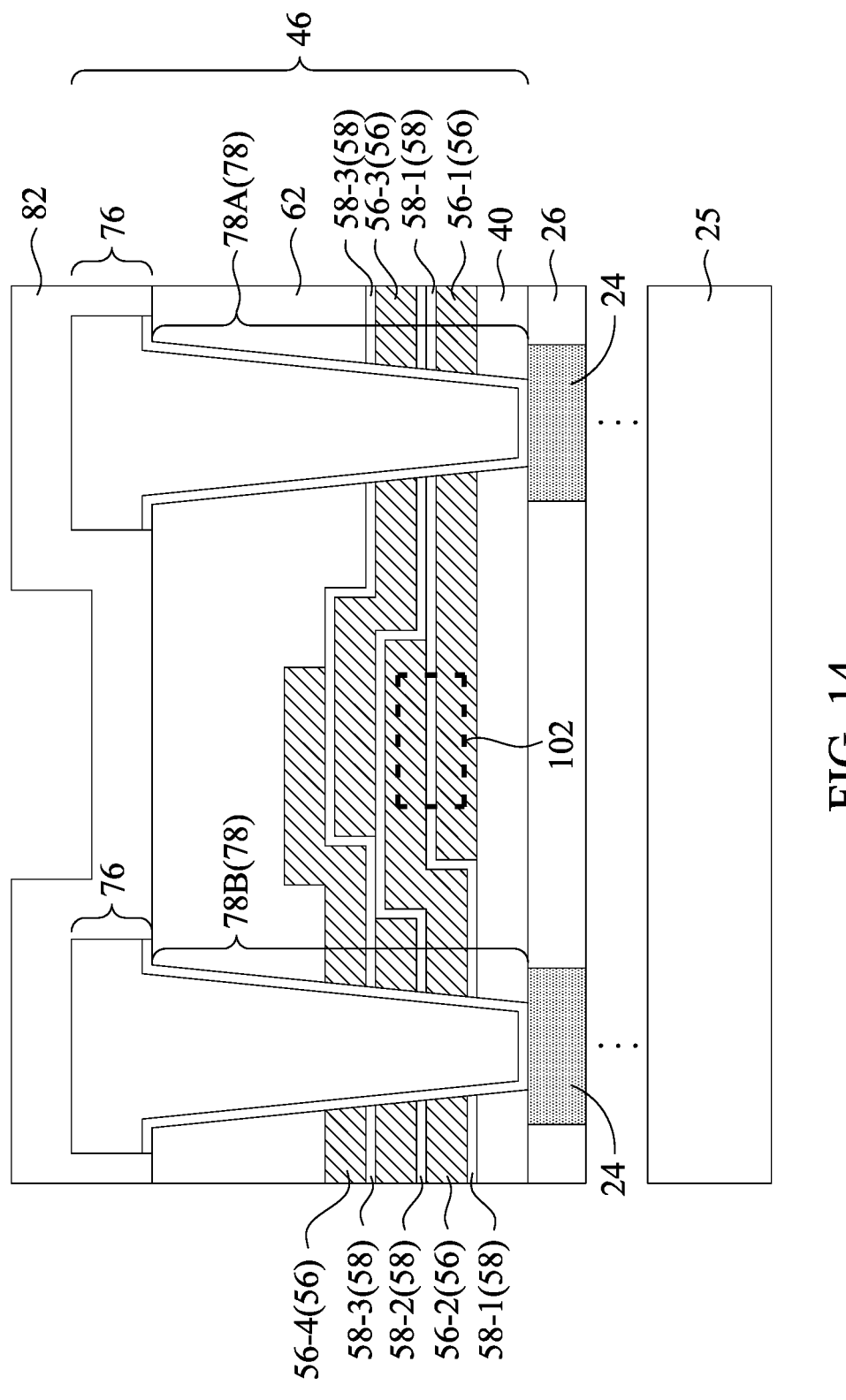

Next, the plating mask 70 as shown in FIG. 13 is removed. In a subsequent process, an etching process is performed to remove the portions of metal seed layer 68 that are not protected by the overlying contact plugs 78 and conductive lines 76. The resulting structure is also shown in FIG. 14. The remaining metal seed layer 68 becomes parts of contact plugs 78 and conductive lines 76. Contact plugs 78 include contact plugs 78A and 78B.

Contact plug 78A is electrically connected to, and electrically shorts, capacitor electrodes 56-1 and 56-3. Contact plug 78B is electrically connected to, and electrically shorts, capacitor electrodes 56-2 and 56-4. Accordingly, capacitor 46 is formed, which include capacitor electrodes 56-1 and 56-3 collectively as a first capacitor electrode, and capacitor electrodes 56-2 and 56-4 collectively as a second capacitor electrode.

FIG. 14 further illustrates the formation of dielectric layer 82. The respective process is illustrated as process 228 in the process flow 200 as shown in FIG. 24. In accordance with some embodiments, dielectric layer 82 is a passivation layer, which may be formed of or comprises silicon nitride, silicon oxide, silicon oxynitride, silicon oxycarbide, or the like, or multi-layers thereof. In accordance with alternative embodiments, dielectric layer 82 may be formed of a low-k dielectric material when the resulting capacitor is one of capacitors 46A or 46B (FIG. 1). In accordance with yet alternative embodiments, dielectric layer 82 may be polymer layer 36 or 42 in the embodiments shown in FIG. 1.

FIGS. 15-20 illustrate magnified views of intermediate stages in the formation of a lower capacitor electrode, a capacitor insulator, and an upper capacitor electrode in accordance with some embodiments. The corresponding processes are shown in the process flow 300 as in FIG. 25. The magnified portion may be the portion 102 in FIG. 14. Some processes as shown in the process flow 300 in FIG. 25 are collectively process 206 in the process flow 200 in FIG. 24.

Figures 15, 16:
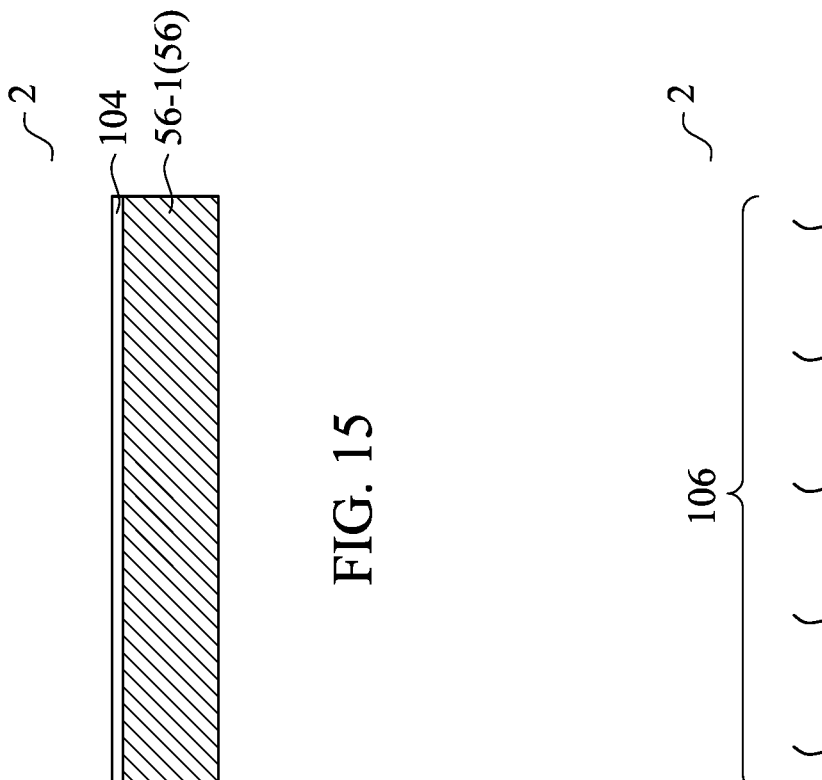
FIGS. 15 through 20 illustrate the magnified cross-sectional views of intermediate stages in the formation of a capacitor insulator and the respective overlying and underlying capacitor electrodes in accordance with some embodiments.

Referring to FIG. 15, capacitor electrode 56-1 is formed. The respective process is illustrated as process 302 in the process flow 300 as shown in FIG. 25. Process 302 also corresponds to processes 202 and 204 in the process 200 as shown in FIG. 24. In accordance with some embodiments as aforementioned, capacitor electrode 56-1 comprises TiN. Accordingly, the subsequent discussion uses TiN as an example, while capacitor electrode 56-1 may be formed of other conductive materials such as TaN. The formation method may include ALD, PECVD, or the like. The precursors may include a titanium-containing precursor such as $Ti(N(CH_3)_2)_4$ (TDMAT), $TiCl_4$, or the like. The precursors further include a nitrogen-containing precursor such as $NH_3$, $N_2$, or the like. Other process gases such as $H_2$ may also be added.

Capacitor electrode 56-1 is deposited in a vacuum chamber, and is deposited as a blanket layer. The respective structure is also shown in FIG. 3. Next, capacitor electrode 56-1 is patterned, and the resulting structure is also shown in FIG. 4. FIG. 15 illustrates a portion of the patterned capacitor electrode 56-1. In order to perform the patterning process, wafer 2 may be exposed to air. Accordingly, a top surface portion of capacitor electrode 56-1 is oxidized (through natural oxidation), and titanium oxide layer 104 is formed. Titanium oxide layer 104 is doped with nitrogen, and may be alternatively referred to as nitrogen-doped titanium oxide layer 104 or TiON layer 104.

Figures 17, 18:
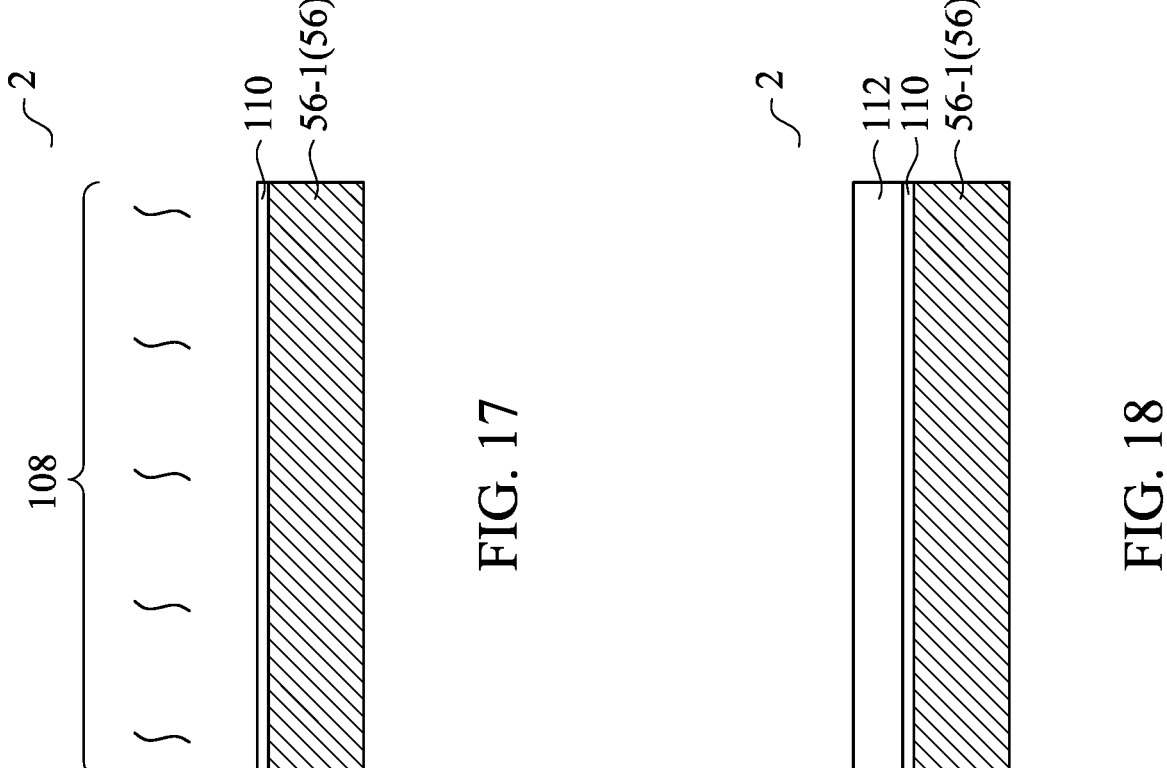

Referring to FIG. 16, a first treatment process 106 is performed. The respective process is illustrated as process 304 in the process flow 300 as shown in FIG. 25. In accordance with some embodiments, a first process gas used for the first treatment process 106 comprises nitrogen ($N_2$). The first treatment process 106 may be performed through $N_2$ plasma. Alternatively, the first process gas may include argon, or the mixture of $N_2$ and argon. In accordance with some embodiments, the first process gas is free from ammonia. In accordance with alternative embodiments, the first process gas comprises ammonia. The flow rate and the partial pressure of ammonia (if used) in the first treatment process, however, are lower than the flow rate and the partial pressure of ammonia in the second treatment process 108 (FIG. 17). In accordance with some embodiments, the treatment is performed with $N_2$ flow rate in a range between about 9,000 sccm and 18,000 sccm. The treatment may be performed for a period of time in the range between about 4 seconds and about 60 seconds.

In accordance with some embodiments, the first treatment process 106 is performed with a low bias power, which may be in the range between about 100 watts and about 1,000 watts. In accordance with alternative embodiments, the first treatment process 106 is performed with no bias power provided. In accordance with yet alternative embodiments, the first treatment process 106 may be performed using remote plasma, in which the $N_2$ plasma is generated remotely and then filtered to remove ions and leaving radicals, which are used for the first treatment process 106.

The first treatment process 106 may have the effect of breaking the bonds of titanium oxide in titanium oxide layer 104. The bonds of the TiN in a top surface portion of capacitor electrode 56-1 may also be broken by the first treatment process 106. Accordingly, some titanium atoms (in titanium oxide and titanium nitride) may have dangling bonds generated.

The first treatment process 106 may also be performed in a vacuum chamber. After the first treatment process 106, titanium oxide layer 104 is further oxidized in an oxidation process. The respective process is illustrated as process 305 in the process flow 300 as shown in FIG. 25. In accordance with some embodiments, the oxidation process is performed through a vacuum break, and wafer 2 is taken out of the vacuum chamber to be exposed to air. In accordance with alternative embodiments, the first treatment process 106 and the subsequent second treatment process 108 are in-situ performed in a same vacuum chamber, with no vacuum break in between. After the first treatment process 106 and before the second treatment process 108, an oxygen-containing process gas such as oxygen (O2), steam ($H_2O$), or the like may be conducted into the vacuum chamber in order to oxidize titanium oxide layer 104. In accordance with yet alternative embodiments, the oxidation process includes conducting oxygen into the vacuum chamber, and then performing the vacuum break.

In the oxidation process, the titanium atoms having the dangling bonds react with oxygen to form titanium oxide. The first treatment process 106 and the subsequent oxidation process collectively result in a more uniform layer of titanium oxide to be formed, which is beneficial for the subsequent formation of the nitrogen-rich titanium oxide. For example, native oxide layer 104 may have thicker portions and thinner portions, and may not have a desirable thickness. Through the first treatment process 106, more dangling bonds are generated in the portions of the TiN directly underlying the thinner portions of titanium oxide layer 104 than the portions of the TiN directly underlying the thicker portions of titanium oxide layer 104. The resulting titanium oxide layer thus has a more uniform thickness, which will result in the subsequently formed nitrogen-rich titanium oxide layer 110 (FIG. 17) to have a more uniform thickness.

Subsequently, as shown in FIG. 17, a second treatment process 108 is performed (in a vacuum chamber) to introduce nitrogen into titanium oxide layer 104, and hence nitrogen-rich titanium oxide layer 110 is formed. The respective process is illustrated as process 306 in the process flow 300 as shown in FIG. 25. It is appreciated that although $N_2$ includes nitrogen, the first treatment process 106 is not efficient in introducing nitrogen into TiO due to the high dissociating energy of $N_2$, and hence few active species are generated by $N_2$ plasma. Accordingly, in the second treatment process, a second process gas comprising a lower dissociating energy (such as $NH_3$) may be used. In accordance with some embodiments, the second process gas, in addition to $NH_3$, may further include $N_2$, $H_2$, or the like, or the combinations thereof.

In accordance with some embodiments, the second process gas is free from $N_2$. In accordance with alternative embodiments, the second process gas comprises $N_2$. The flow rate and the partial pressure of $N_2$ (if used) in the second treatment process 108, however, are lower than the flow rate and the partial pressure of $N_2$ in the first treatment process 106.

In accordance with some embodiments, the second treatment process 108 is performed with plasma being generated from the second process gas. The process conditions of the second treatment process 108 may include a source power in a range between about 100 watts and about 1,000 watts, an $NH_3$ flow rate in the range between about 1,000 sccm and 5,000 sccm, and a duration in the range between about 4 seconds and about 60 seconds. The second treatment process 108 is selected so that either an entirety of titanium oxide layer 104 is nitridated, or a top surface portion (but not the bottom portion) of titanium oxide layer 104 is nitridated. For example, the second treatment process 108 may be performed without applying bias power, or may be performed by applying a low bias power, for example, lower than about 50 watts or lower than about 10 watts.

In accordance with alternative embodiments, the second treatment process 108 is performed using a thermal process. For example, the thermal process may be performed by heating wafer 2 to a temperature in a range between about 300° C. and about 1,000° C. when wafer 2 is exposed to the second process gas. The duration of the thermal process may be in the range between about 5 minutes and about 120 minutes.

As a result of the second treatment process 108, nitrogen is doped into titanium oxide layer 104, and hence titanium oxide layer 104 is converted into nitrogen-rich titanium oxide layer 110. In accordance with some embodiments, assuming the nitrogen atomic percentage in titanium oxide layer 104 is NAP104, and nitrogen atomic percentage in nitrogen-rich titanium oxide layer 110 is NAP110, the difference (NAP110-NAP104) may be greater than about 10 percent, and may in the range between about 10 percent and about 50 percent.

Next, referring to FIG. 18, dielectric layer 112 is deposited. The respective process is illustrated as process 308 in the process flow 300 as shown in FIG. 25. Dielectric layer 112 acts as a part of the capacitor insulator of the resulting capacitor. In accordance with some embodiments, dielectric layer 112 is a high-k dielectric layer having a high dielectric constant value (k value), which may be, for example, higher than about 4.0, higher than about 7.0, or higher. In accordance with some embodiments, dielectric layer 112 includes hafnium oxide ($HfO_2$), zirconium oxide ($ZrO_2$), hafnium zirconium oxide (HfZrO), or the like, which may suffer from oxygen vacancy problems that can be fixed by forming nitrogen-rich titanium oxide layer 110. In accordance with some embodiments, dielectric layer 112 may include a plurality of hafnium oxide layers and a plurality of zirconium oxide layers deposited alternatingly. The resulting dielectric layer 112, with hafnium oxide and zirconium oxide inter-diffused, is referred to as a HfZrO layer.

In accordance with some embodiments, the zirconium oxide layers and the hafnium oxide layers are deposited using ALD, Plasma-Enhanced Atomic Layer Deposition (PEALD), or the like. In accordance with some embodiments, the precursors for depositing zirconium oxide may comprise $ZrCl_4$ and water steam ($H_2O$). The precursors for depositing the hafnium oxide layers may include $HfCl_4$ and water steam ($H_2O$). The thickness of dielectric layer 112 may be in the range between about 40 Å and about 90 Å.

Capacitor electrode 56-1 has the tendency of scavenging the oxygen in dielectric layer 112. The oxygen in dielectric layer 112, which includes an oxide layer (layers), may diffuse into capacitor electrode 56-1, causing oxygen vacancies in dielectric layer 112, especially in the bottom part of dielectric layer 112. The oxygen vacancies result in the degradation in the performance and the reliability of the resulting capacitor. By forming the nitrogen-rich titanium oxide layer 110 with a high nitrogen atomic percentage, nitrogen-rich titanium oxide layer 110 has improved ability in blocking oxygen from diffusing through, and hence capacitor electrode 56-1 is less likely to scavenge oxygen from dielectric layer 112.

Furthermore, due to the first treatment process 106, which results in a more uniform titanium oxide layer (after the oxidation process), a more uniform nitrogen-rich titanium oxide layer 110 that has a uniform thickness is formed. The ability of nitrogen-rich titanium oxide layer 110 for blocking oxygen diffusion is further improved.

Figure 19:
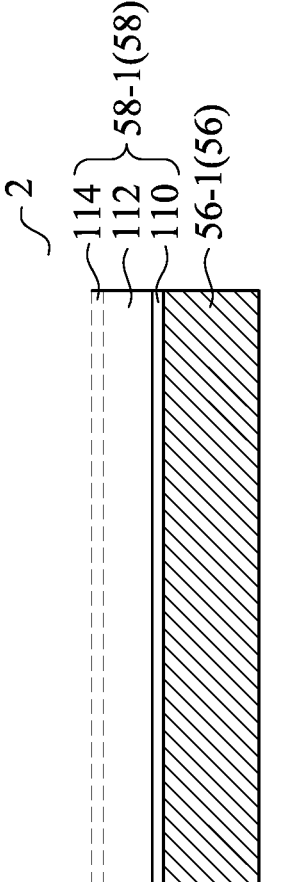

FIG. 19 illustrates the deposition of titanium oxide layer 114 in accordance with some embodiments. The respective process is illustrated as process 310 in the process flow 300 as shown in FIG. 25. Titanium oxide layer 114 is formed through a deposition process, which may be an ALD process, a CVD process, or the like. In accordance with alternative embodiments, titanium oxide layer 114 is not deposited, and the subsequently formed capacitor electrode 56-2 is in physical contact with dielectric layer 112.

Figure 20:
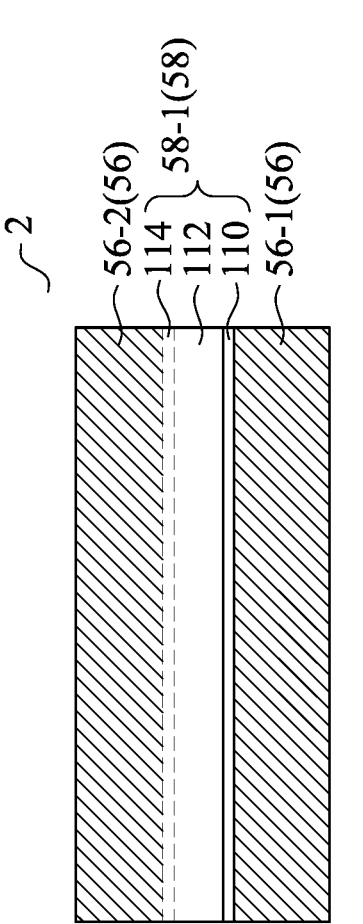

FIG. 20 illustrates the formation of capacitor electrode 56-2, and the corresponding process is also illustrated in FIGS. 6 and 7. The respective process is illustrated as process 312 in the process flow 300 as shown in FIG. 25, and as process 210 in the process flow 200 as shown in FIG. 24. In FIG. 20, nitrogen-rich titanium oxide layer 110, dielectric layer 112, and titanium oxide layer 114 (if formed) are collectively referred to as capacitor insulator 58-1, which is also shown in FIG. 6. In subsequent processes, more capacitor electrodes 56 and capacitor insulators 58 may be (or may not be) formed (as shown in FIGS. 8-14) to continue the formation of capacitor 46. The formation of the overlying capacitor electrodes 56 and capacitor insulators 58 may be essentially the same as the formation of capacitor electrode 56-1 and capacitor insulator 58-1, respectively.

Figure 21:
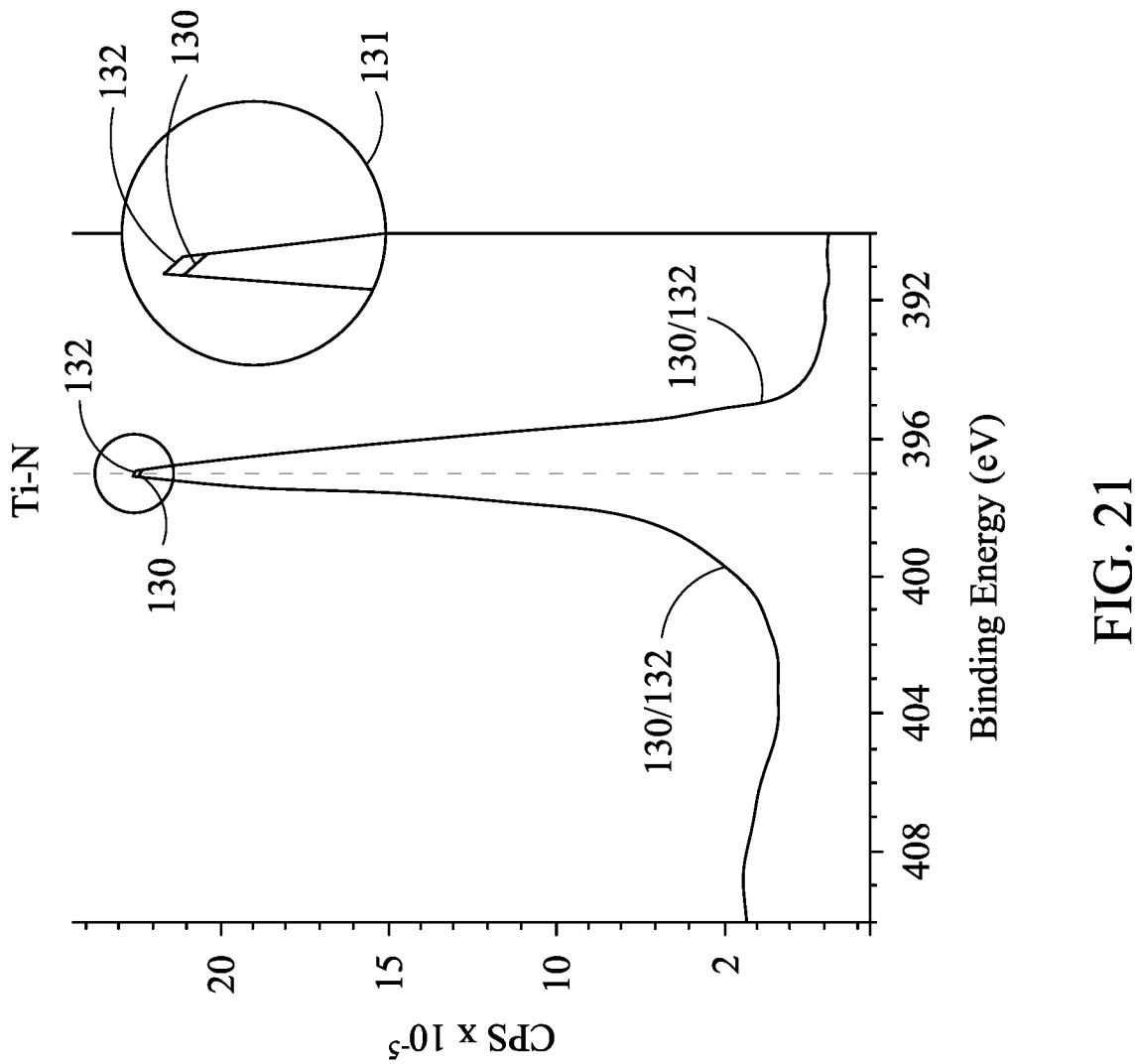
FIGS. 21 through 23 illustrate some results of the MIM capacitor in accordance with some embodiments.

FIG. 21 illustrates the XPS counts per second (CPS) as a function of binding energy of two samples. Line 130 is obtained from a first sample TiO layer that is treated using $N_2$, and is not treated using $NH_3$. Line 132 is obtained from a second sample TiO layer treated by $N_2$, followed by the treatment using $NH_3$. The top portions of lines 130 and 132 are amplified in circle 131. The peaks of Ti—N bonds are observed, and it is found that the peak of line 132 is higher than the peak of line 130. This proves that with the second treatment process using $NH_3$, the Ti—N bonds in the second sample TiO layer is increased over that in the first sample TiO layer.

Figure 22:
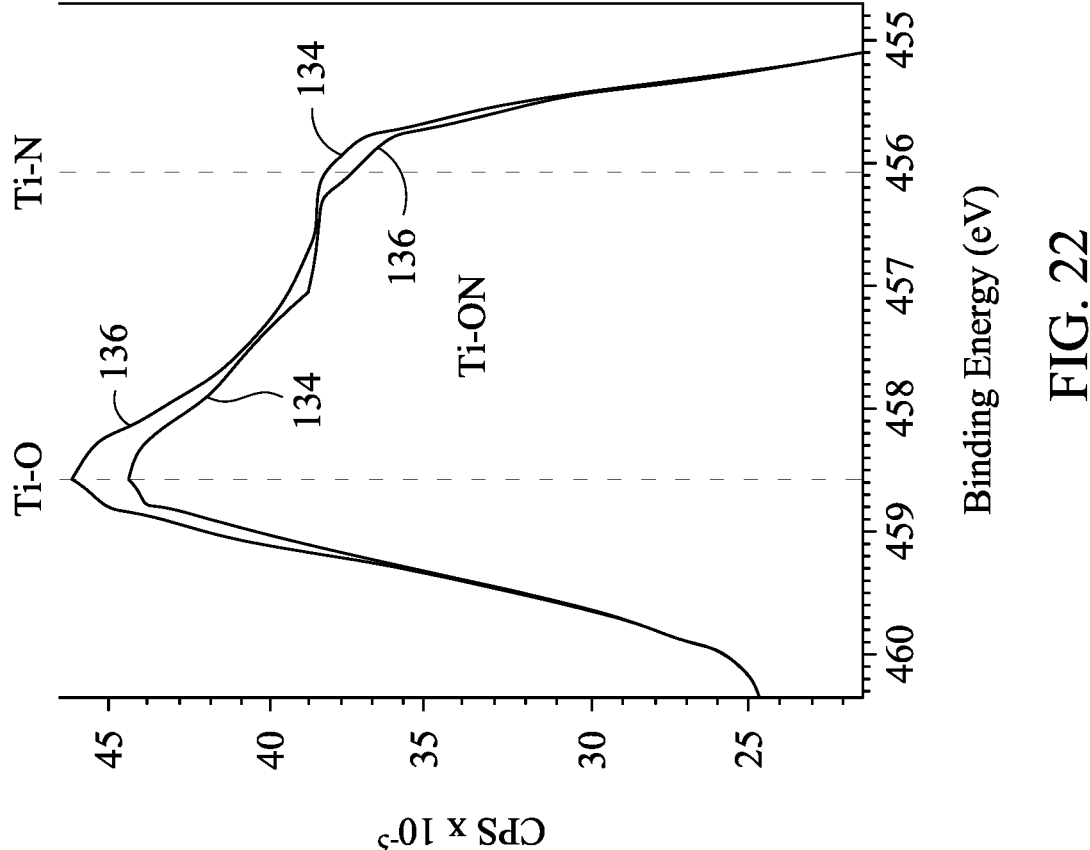

FIG. 22 illustrates the XPS CPS as a function of binding energy of two samples. The first sample is a TiO layer that is treated using $N_2$, and is not treated using $NH_3$. The measurement is performed after the first sample is treated using ozonated DI water ($DIO_3$), and line 136 shows the result. The second sample is a TiO layer that is treated using $N_2$ followed by $NH_3$. The measurement is also performed after the second sample is treated using $DIO_3$, and line 134 shows the result. It is observed that line 134 has lower Ti—O peak than line 136, indicating that it is more difficult to oxidize (when $DiO_3$ is used) the second sample. This proves that the second sample is more resistance to oxygen penetration than the first sample. Also, line 134 has a higher Ti—N peak than line 136, indicating that the surface portion of the second sample has a higher nitrogen atomic percentage than the first sample.

Figure 23:
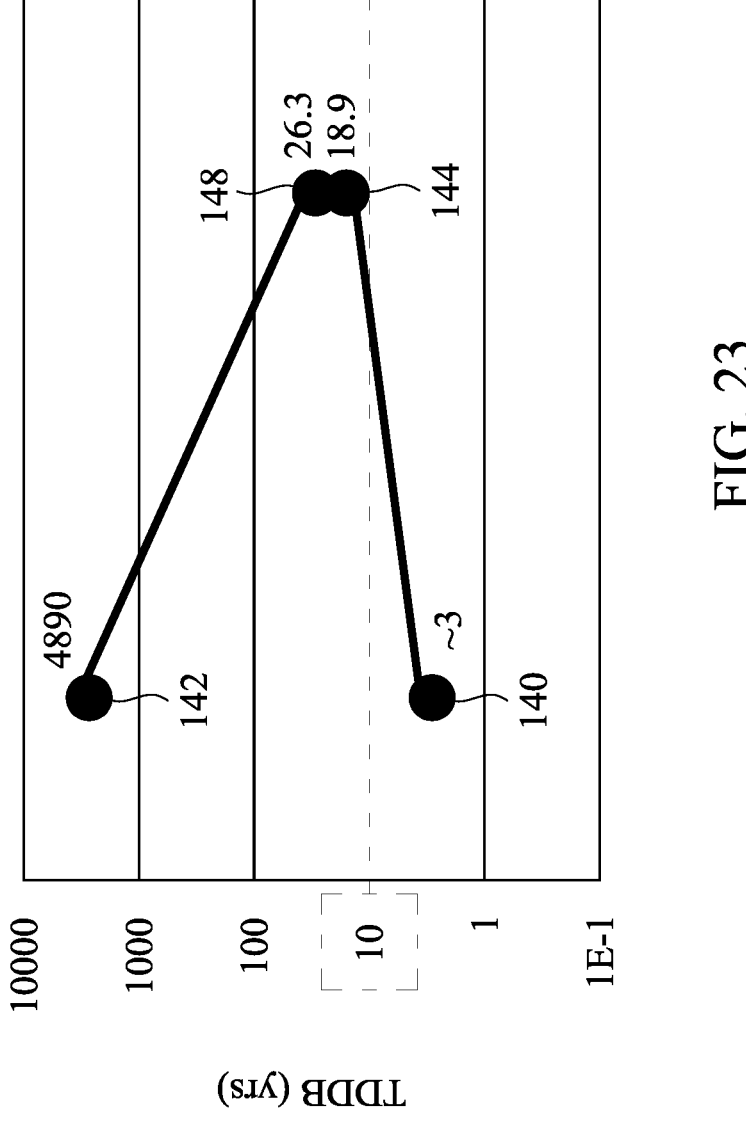

FIG. 23 illustrates the forward Time-Dependent Break Down (TDDB) time and reversed TDDB time of first sample capacitors and second sample capacitors. Dots 140 and 142 are obtained from the first sample capacitors that are treated using $N_2$, and are not treated using $NH_3$. Dots 144 and 146 are obtained from second sample capacitors that are treated by $N_2$, followed by the treatment using $NH_3$. Dots 140 and 142 are the forward TDDB and the reverse TDDB, respectively of the first sample capacitors. It is observed that dot 140 corresponding to TDDB of 3 years, which is lower than what is required (10 years) by specification. Dots 144 and 146 are the forward TDDB and the reverse TDDB, respectively of the second sample capacitors. It is observed that dot 144 is improved over dot 140, and has a TDDB of more than 10 years. The corresponding capacitors will meet the requirement of specification, which requires 10 years TDDB time.

The embodiments of the present disclosure have some advantageous features. By performing an $NH_3$ treatment process on a titanium oxide layer in a capacitor, the titanium oxide layer becomes a nitrogen-rich titanium oxide layer. The ability of the nitrogen-rich titanium oxide layer for blocking oxygen diffusion is improved, and the reliability of the resulting capacitor is improved.

In accordance with some embodiments of the present disclosure, a method comprises forming a first electrode; performing a first treatment process on a first oxide layer over the first electrode, wherein the first treatment process is performed using a first process gas comprising ammonia; depositing a high-k dielectric layer over the first oxide layer; forming a second electrode over the high-k dielectric layer; forming a first contact plug electrically connecting to the first electrode; and forming a second contact plug electrically connecting to the second electrode. In an embodiment, the first oxide layer comprises a native oxide of the first electrode, and wherein the first treatment process results in a nitrogen atomic percentage in the first oxide layer to increase.

In an embodiment, the method further comprises, before the first treatment process, performing a second treatment process on the first oxide layer using a second process gas, wherein the second process gas comprises nitrogen ($N_2$). In an embodiment, the method further comprises performing a vacuum break between the first treatment process and the second treatment process. In an embodiment, the method further comprises, at a time between the first treatment process and the second treatment process, conducting oxygen ($O_2$) to the first oxide layer.

In an embodiment, the first treatment process is performed by generating plasma from the first process gas. In an embodiment, the first treatment process is performed using remote plasma generated from the first process gas. In an embodiment, the depositing the high-k dielectric layer comprises depositing a hafnium oxide layer; and depositing a zirconium oxide layer. In an embodiment, the forming the first electrode comprises depositing a titanium nitride layer.

In accordance with some embodiments of the present disclosure, a method comprises method comprises forming a capacitor comprising forming a first capacitor electrode on a wafer, wherein the first capacitor electrode comprises a metal nitride; performing a first treatment process on the wafer using a first process gas comprising nitrogen ($N_2$); performing a second treatment process on the wafer using a second process gas comprising ammonia ($NH_3$); forming a dielectric layer over the first capacitor electrode; and forming a second capacitor electrode over the dielectric layer.

In an embodiment, the second treatment process is performed after the first treatment process. In an embodiment, the first process gas is free from ammonia. In an embodiment, the second process gas is free from nitrogen ($N_2$). In an embodiment, the first treatment process and the second treatment process comprise generating plasma from the first process gas and the second process gas, respectively.

In accordance with some embodiments of the present disclosure, a method comprises depositing a first titanium nitride layer; patterning the first titanium nitride layer to form a first electrode, wherein a first titanium oxide layer is formed at a top surface of the first titanium nitride layer; performing a plasma treatment process on the first titanium oxide layer using a first process gas comprising nitrogen ($N_2$); after the plasma treatment process, performing a nitridation process to increase a nitrogen atomic percentage in the first titanium oxide layer; forming a high-k dielectric layer over the first titanium oxide layer; and forming a second capacitor electrode over the high-k dielectric layer.

In an embodiment, the method further comprises forming a second titanium oxide layer over the high-k dielectric layer, wherein the second capacitor electrode is formed over the high-k dielectric layer. In an embodiment, the nitridation process is performed using ammonia as a process gas. In an embodiment, the nitridation process is performed using plasma. In an embodiment, the method further comprises a vacuum break between the plasma treatment process and the nitridation process. In an embodiment, the method further comprises, at a time after the plasma treatment process and before the nitridation process, conducting oxygen to the first titanium oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first electrode;
performing a first treatment process on a first oxide layer over the first electrode using a first process gas, wherein the first process gas comprises nitrogen ($N_2$);
after the first treatment process, performing a second treatment process on the first oxide layer, wherein the second treatment process is performed using a second process gas comprising ammonia;

depositing a high-k dielectric layer over the first oxide layer;
forming a second electrode over the high-k dielectric layer;
forming a first contact plug electrically connecting to the first electrode; and
forming a second contact plug electrically connecting to the second electrode.

2. The method of claim 1, wherein the first oxide layer comprises a native oxide of the first electrode, and wherein the second treatment process results in a nitrogen atomic percentage in the first oxide layer to increase.

3. The method of claim 1 further comprising performing a vacuum break between the first treatment process and the second treatment process.

4. The method of claim 1 further comprising, at a time between the first treatment process and the second treatment process, conducting oxygen ($O_2$) to the first oxide layer.

5. The method of claim 1, wherein the first treatment process is performed by generating plasma from the first process gas.

6. The method of claim 1, wherein the first treatment process is performed using remote plasma generated from the first process gas.

7. The method of claim 1, wherein the depositing the high-k dielectric layer comprises:
depositing a hafnium oxide layer; and
depositing a zirconium oxide layer.

8. The method of claim 1, wherein the forming the first electrode comprises depositing a titanium nitride layer.

9. The method of claim 1, wherein the second process gas is free from nitrogen ($N_2$).

10. A method comprising:
forming a capacitor comprising:
forming a first capacitor electrode on a wafer, wherein the first capacitor electrode comprises a metal nitride;
forming an oxide layer over the first capacitor electrode;
performing a first treatment process on the oxide layer using a first process gas comprising nitrogen ($N_2$);
performing a second treatment process on the oxide layer using a second process gas comprising ammonia ($NH_3$), wherein the first treatment process and the second treatment process convert the oxide layer as a nitrogen-rich oxide layer;
forming a dielectric layer over the nitrogen-rich oxide layer; and
forming a second capacitor electrode over the dielectric layer.

11. The method of claim 10, wherein the second treatment process is performed after the first treatment process.

12. The method of claim 10, wherein the first process gas is free from ammonia.

13. The method of claim 10, wherein the second process gas is free from nitrogen ($N_2$).

14. The method of claim 10, wherein the first treatment process and the second treatment process comprise generating plasma from the first process gas and the second process gas, respectively.

15. A method comprising:
depositing a first titanium nitride layer;
patterning the first titanium nitride layer to form a first electrode, wherein a first titanium oxide layer is formed at a top surface of the first titanium nitride layer;

performing a plasma treatment process on the first titanium oxide layer using a first process gas comprising nitrogen ($N_2$);

after the plasma treatment process, performing a nitridation process to increase a nitrogen atomic percentage in the first titanium oxide layer;

forming a high-k dielectric layer over the first titanium oxide layer; and forming a second capacitor electrode over the high-k dielectric layer.

16. The method of claim 15 further comprising forming a second titanium oxide layer over the high-k dielectric layer, wherein the second capacitor electrode is formed over the high-k dielectric layer.

17. The method of claim 15, wherein the nitridation process is performed using ammonia as a process gas.

18. The method of claim 15, wherein the nitridation process is performed using plasma.

19. The method of claim 15 further comprising a vacuum break between the plasma treatment process and the nitridation process.

20. The method of claim 15 further comprising, at a time after the plasma treatment process and before the nitridation process, conducting oxygen to the first titanium oxide layer.

* * * * *